United States Patent
Fukuda

(10) Patent No.: US 11,532,454 B2
(45) Date of Patent: Dec. 20, 2022

(54) IMAGING METHOD AND IMAGING SYSTEM

(71) Applicant: Hitachi High-Tech Corporation, Tokyo (JP)

(72) Inventor: Hiroshi Fukuda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 73 days.

(21) Appl. No.: 17/282,974

(22) PCT Filed: Nov. 12, 2018

(86) PCT No.: PCT/JP2018/041780
§ 371 (c)(1),
(2) Date: Apr. 5, 2021

(87) PCT Pub. No.: WO2020/100179
PCT Pub. Date: May 22, 2020

(65) Prior Publication Data
US 2021/0350999 A1    Nov. 11, 2021

(51) Int. Cl.
*H01J 37/22*    (2006.01)
*H01J 37/305*    (2006.01)
(Continued)

(52) U.S. Cl.
CPC .......... *H01J 37/22* (2013.01); *G01N 23/2251* (2013.01); *H01J 37/20* (2013.01);
(Continued)

(58) Field of Classification Search
CPC ...... H01J 37/22; H01J 37/222; H01J 37/3056; H01J 2237/20214; H01J 2237/31745; G01N 23/2251
See application file for complete search history.

(56) References Cited

U.S. PATENT DOCUMENTS 5,892,225 A * 4/1999 Okihara ............... G01N 1/32
                                                         250/311
2012/0298884 A1    11/2012 Nakajima et al.

FOREIGN PATENT DOCUMENTS

JP    3-36285 A    2/1991
JP    9-189649 A    7/1997
(Continued)

OTHER PUBLICATIONS

International Search Report (PCT/ISA/210) issued in PCT Application No. PCT/JP2018/041780 dated Feb. 5, 2019 with English translation (five (5) pages).
(Continued)

*Primary Examiner* — Eliza W Osenbaugh-Stewart
(74) *Attorney, Agent, or Firm* — Crowell & Moring LLP

(57) ABSTRACT

This invention pertains to an imaging method, the purpose of which is to reveal, over a wide range, information about a plurality of layers contained in a multilayer structure, or form an image of the revealed applicable layers. The method proposed includes: a step in which, while rotating the sample with the axis of the normal line of the sample surface as the axis of rotation, the sample is irradiated with an ion beam from a direction inclined with respect to the normal line direction, via a mask having an opening which selectively allows the passage of an ion beam and which is disposed at a position distant from the sample, thereby forming a hole with a band-shaped sloped surface that is inclined with respect to the sample surface; and a step in which a first image viewed from a direction intersecting with the sloped surface of the applicable layer is formed, on the basis of a signal obtained by irradiating, with a charged particle beam, the applicable layer contained in the band-shaped sloped surface.

17 Claims, 18 Drawing Sheets

(51) Int. Cl.
*H01J 37/20* (2006.01)
*H01J 37/31* (2006.01)
*G01N 23/2251* (2018.01)

(52) U.S. Cl.
CPC ........ *H01J 37/222* (2013.01); *H01J 37/3056* (2013.01); *H01J 37/31* (2013.01); *H01J 2237/20214* (2013.01); *H01J 2237/31745* (2013.01)

(56) References Cited

FOREIGN PATENT DOCUMENTS

| JP | 2003-68243 A | 3/2003 |
| JP | 2003-162973 A | 6/2003 |
| JP | 2007-248091 A | 9/2007 |
| JP | 2009-216478 A | 9/2009 |
| JP | 2011-154920 A | 8/2011 |

OTHER PUBLICATIONS

Japanese-language Written Opinion (PCT/ISA/237) issued in PCT Application No. PCT/JP2018/041780 dated Feb. 5, 2019 (four (4) pages).

\* cited by examiner

[FIG. 1]
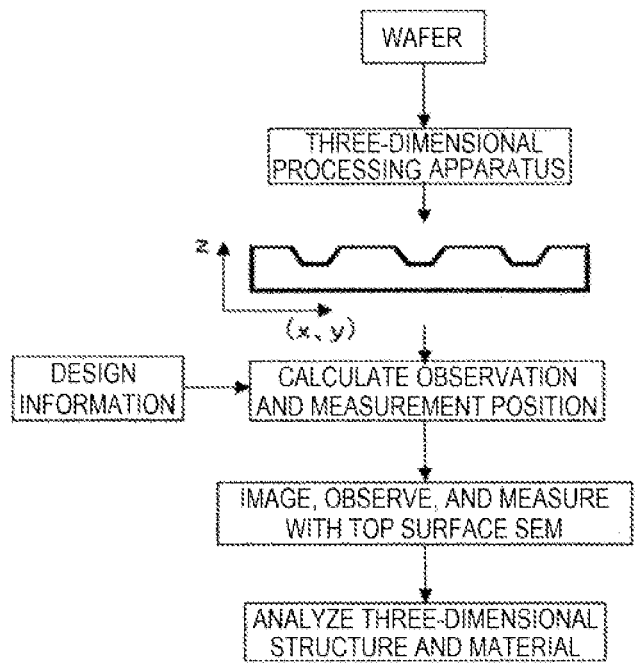
[FIG. 2]
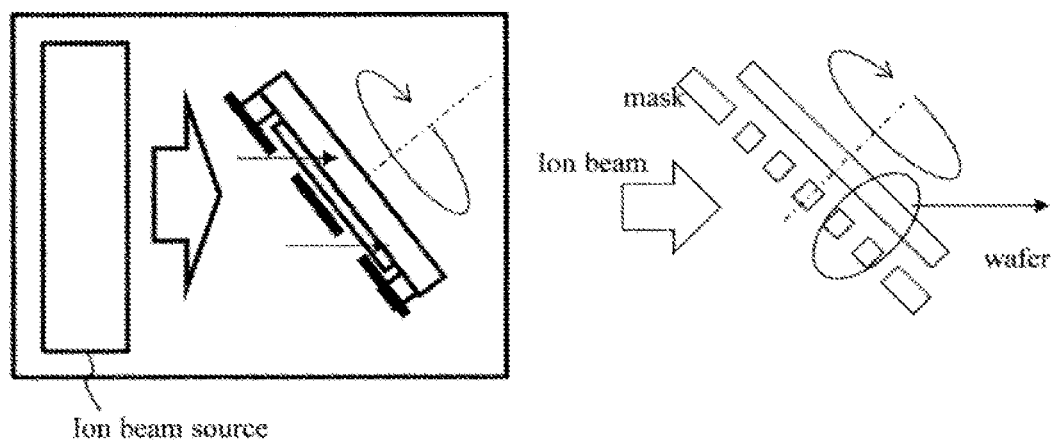

[FIG. 3]
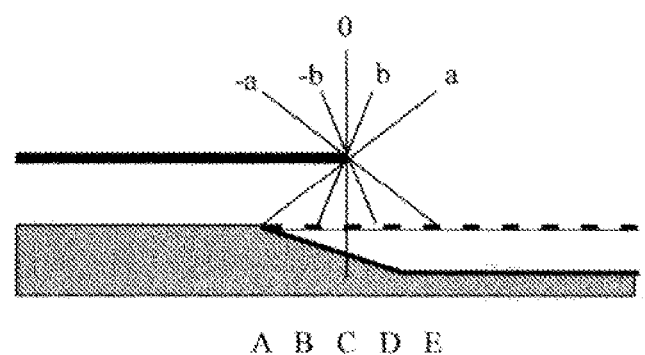
[FIG. 4]
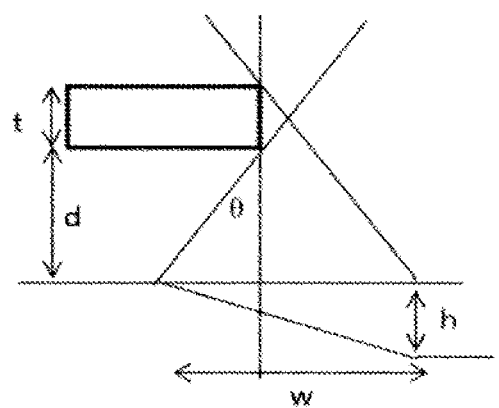

[FIG. 5]
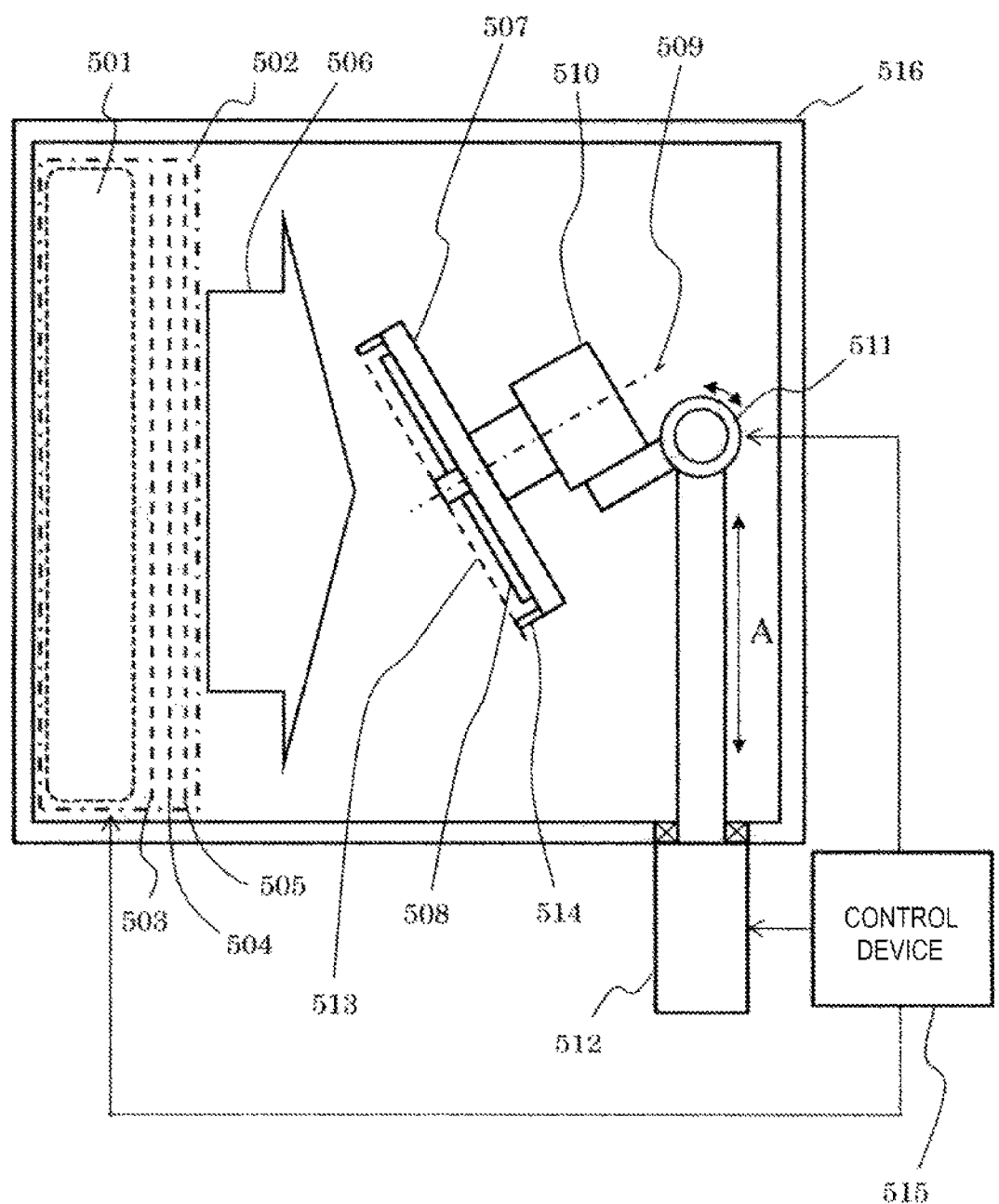

[FIG. 7]
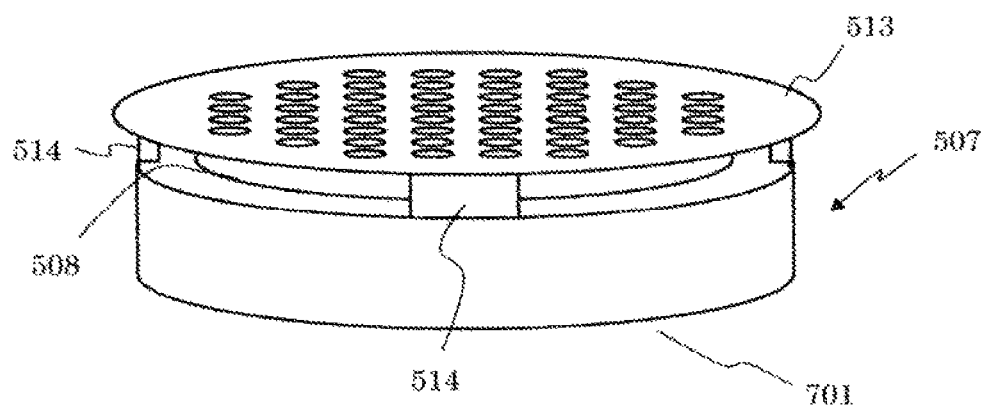

[FIG. 8]
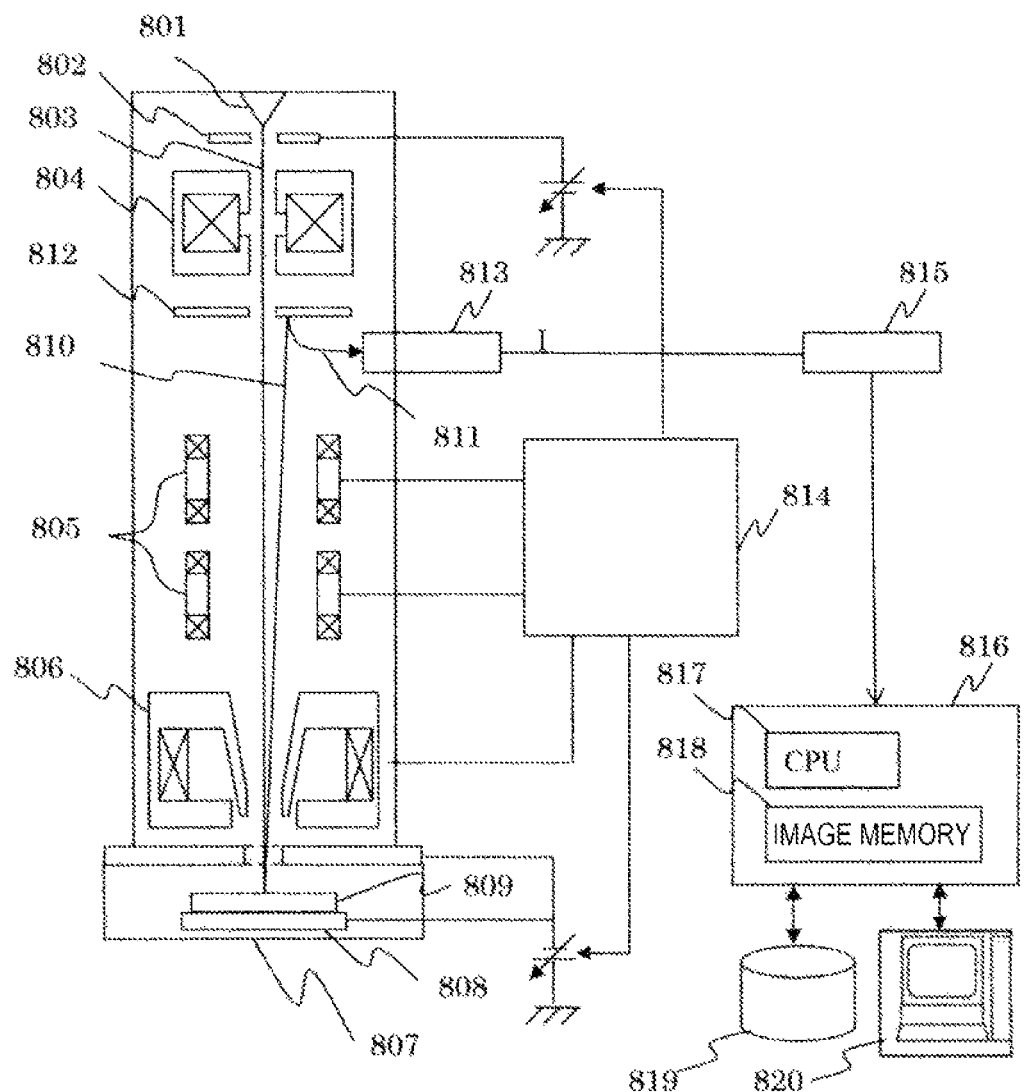

[FIG. 9]
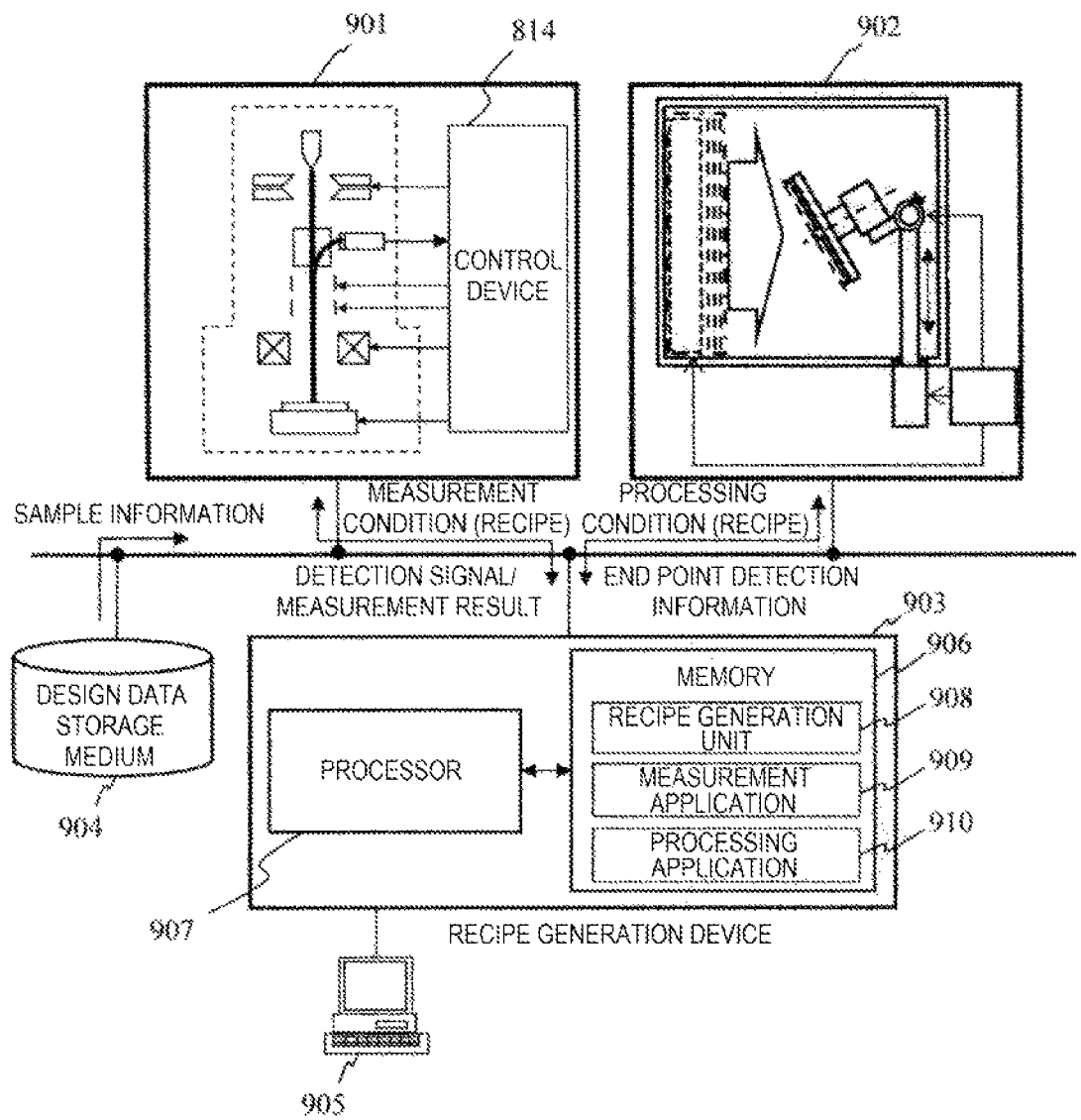

[FIG. 10]
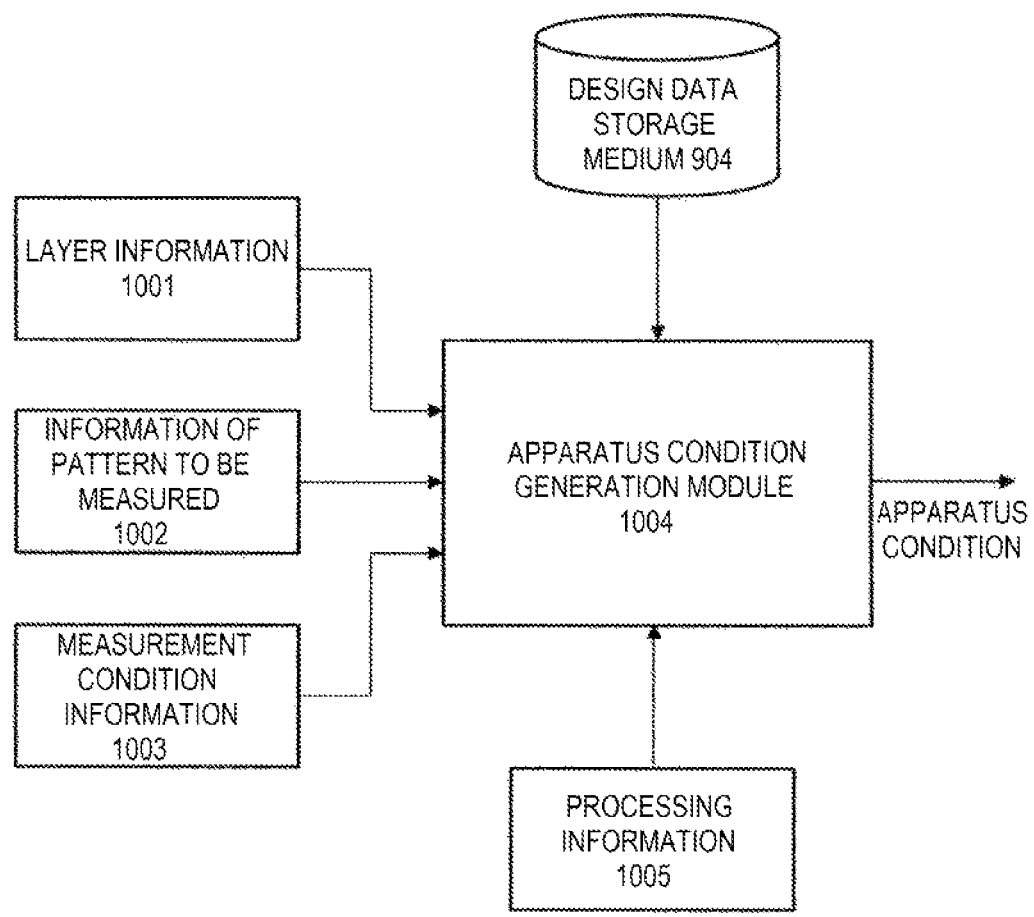

[FIG. 11]
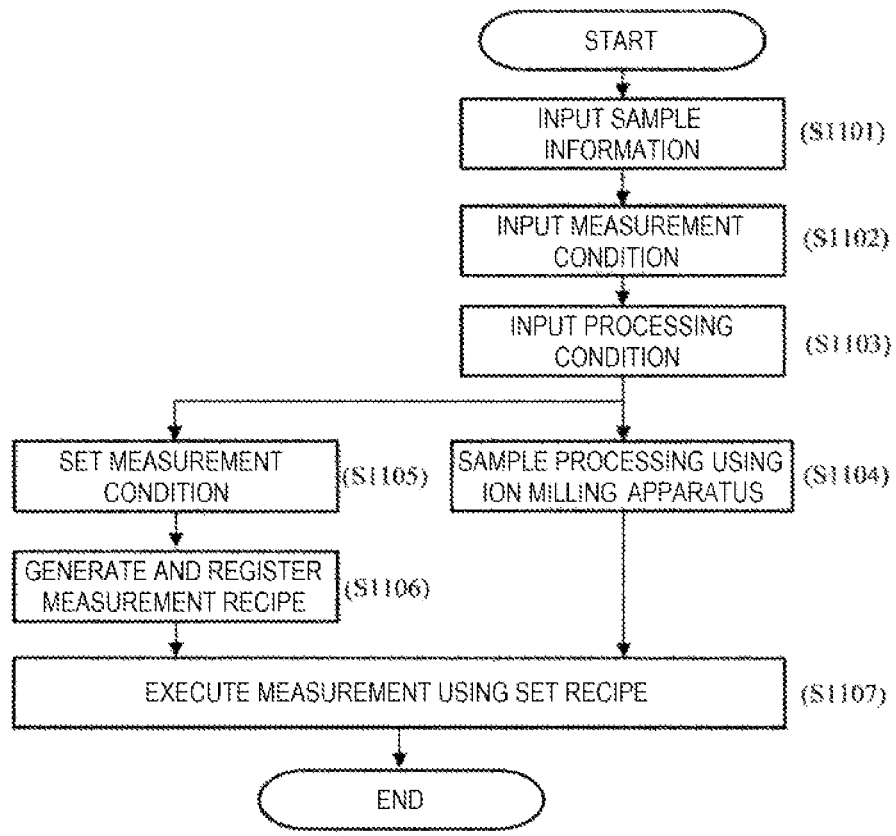

[FIG. 12]
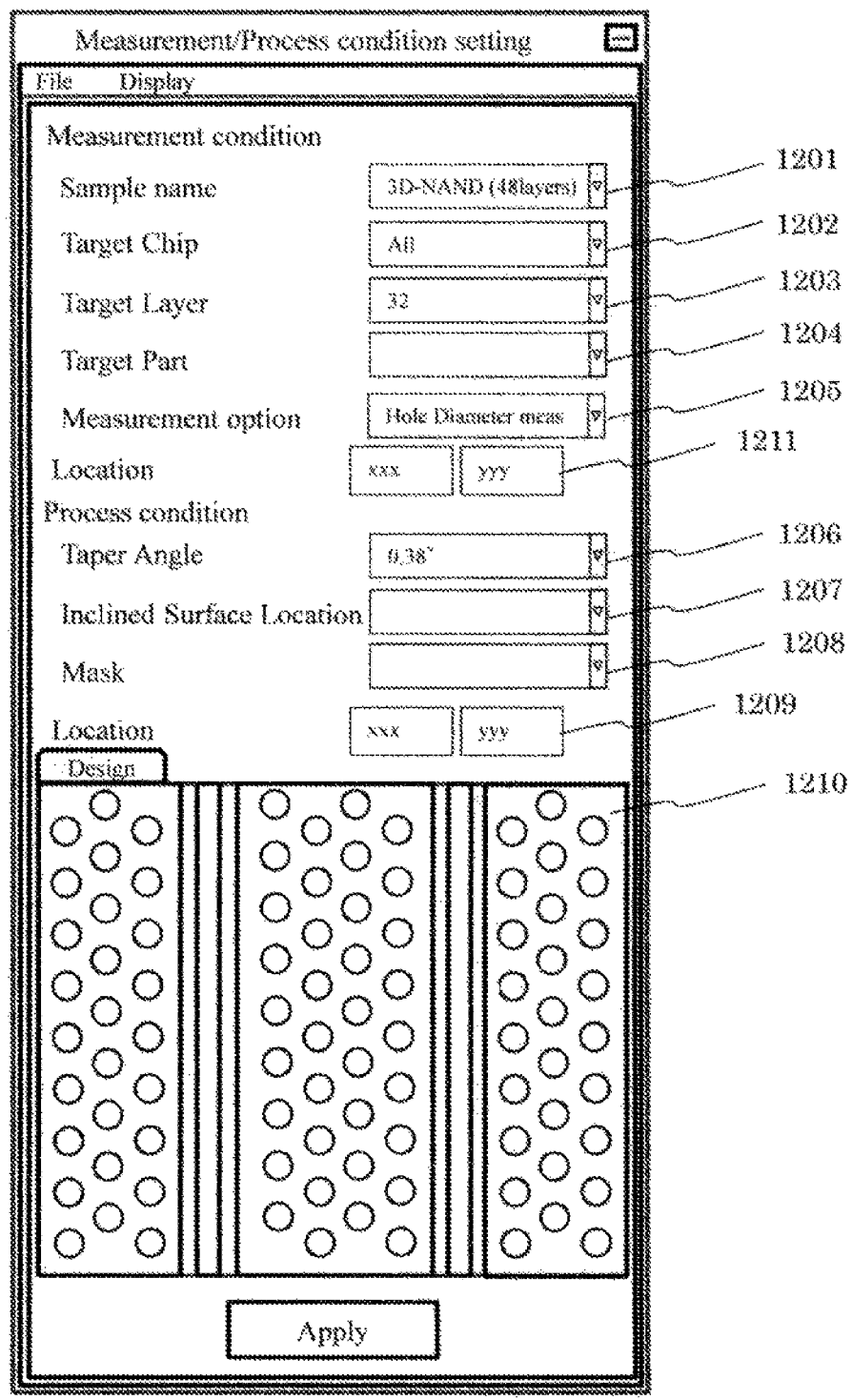

FIG. 13A
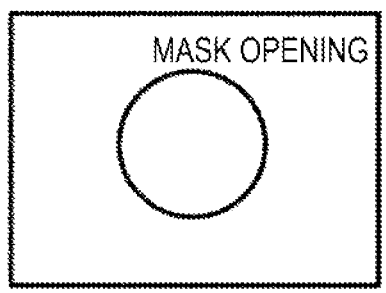
FIG. 13B
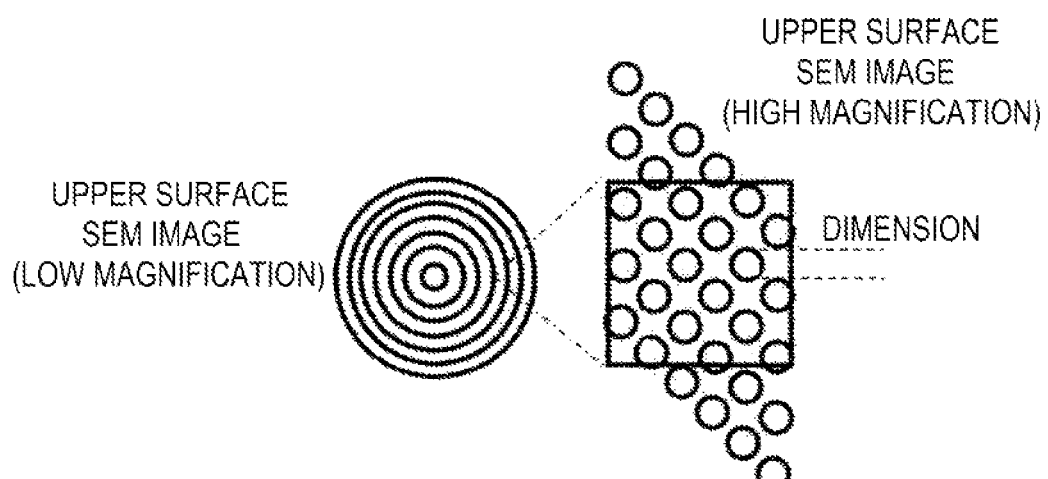
FIG. 13C
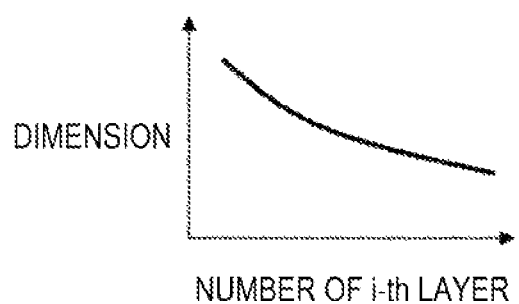
FIG. 13D

[FIG. 14]
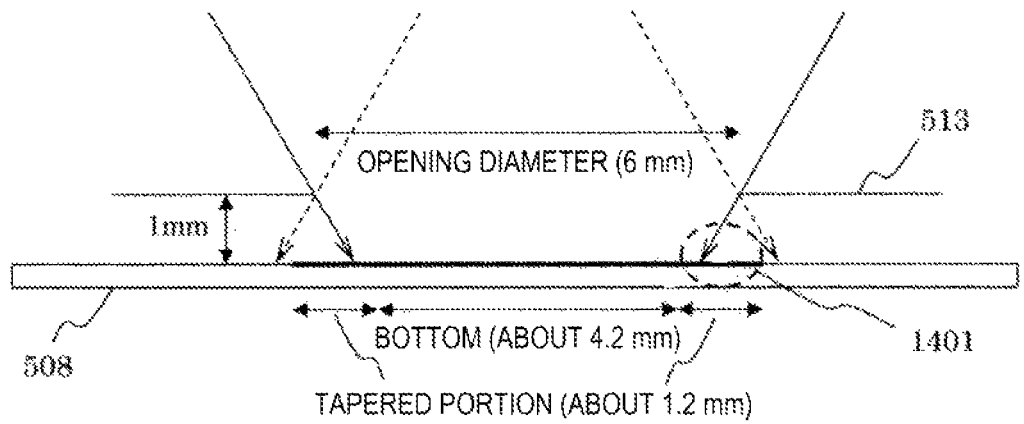
[FIG. 15]
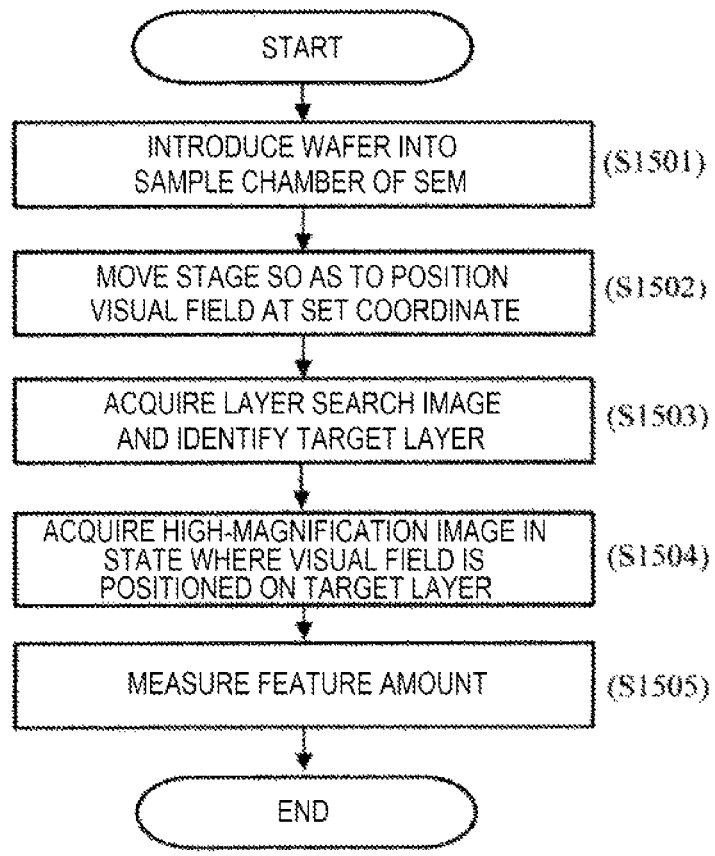

[FIG. 16]
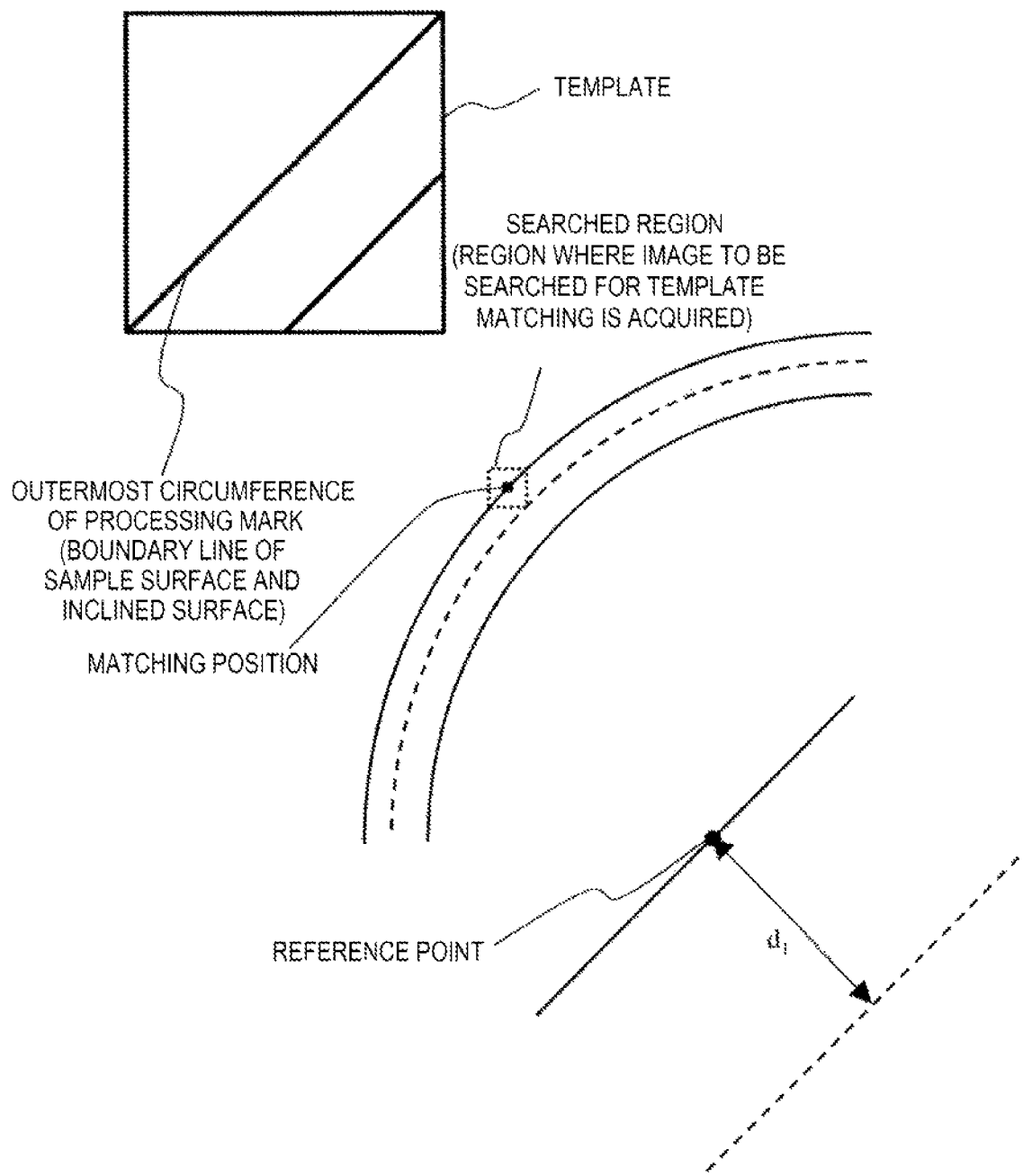

FIG. 17
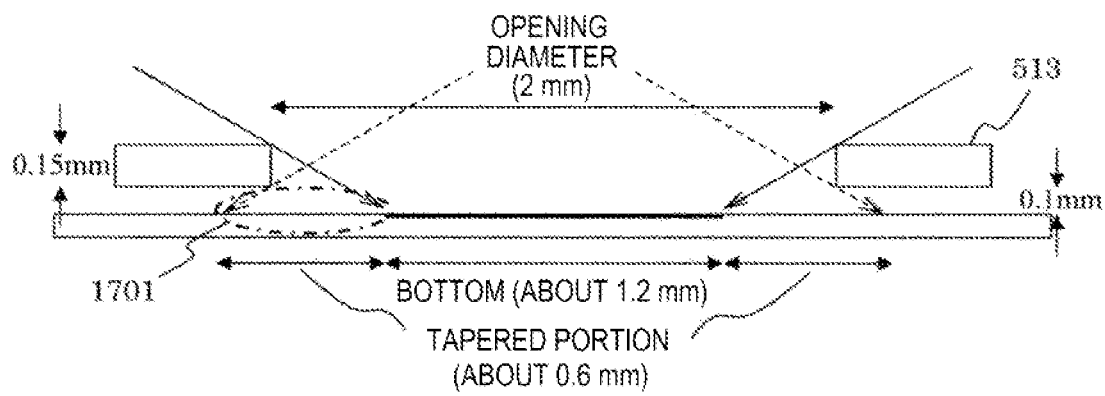
FIG. 18A
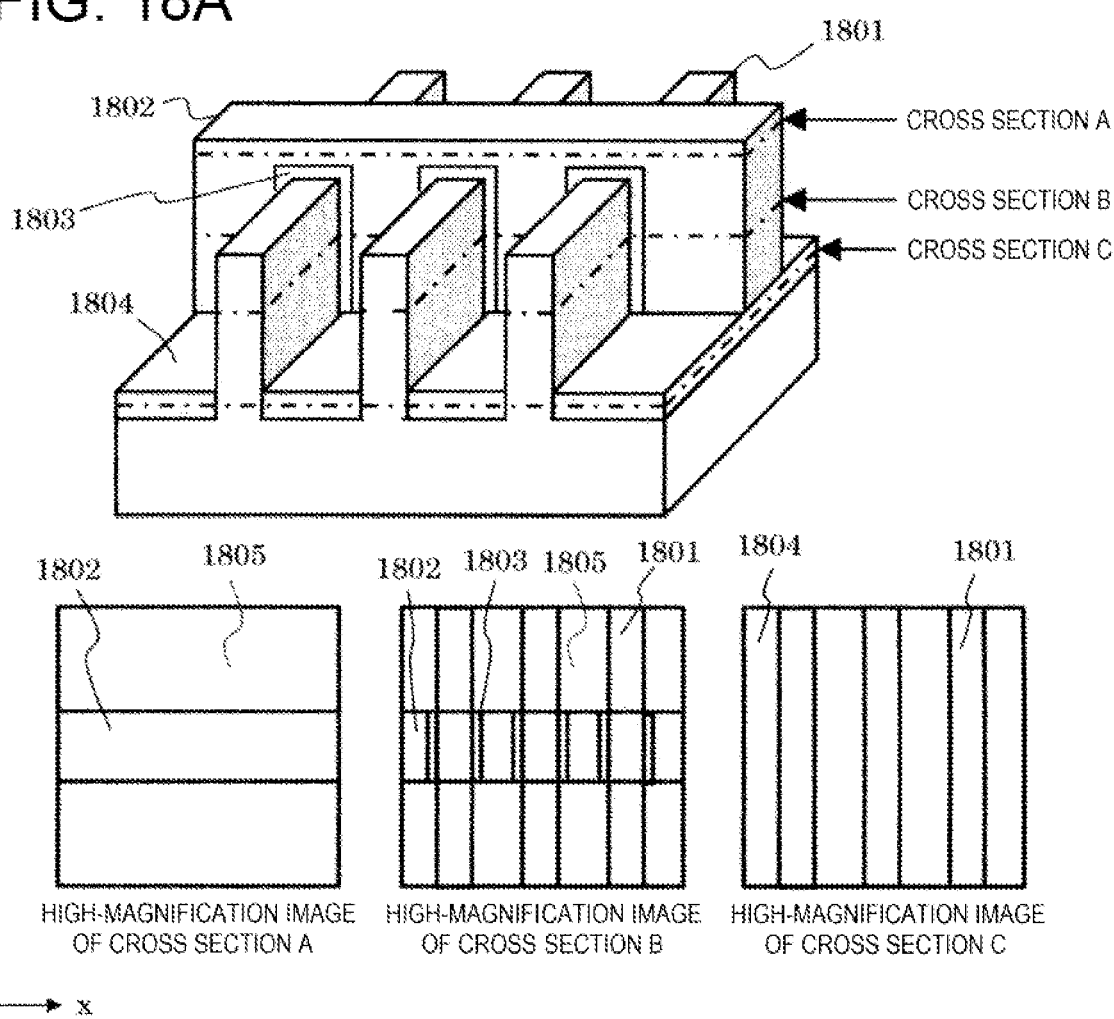
FIG. 18B    FIG. 18C    FIG. 18D

[FIG. 19]
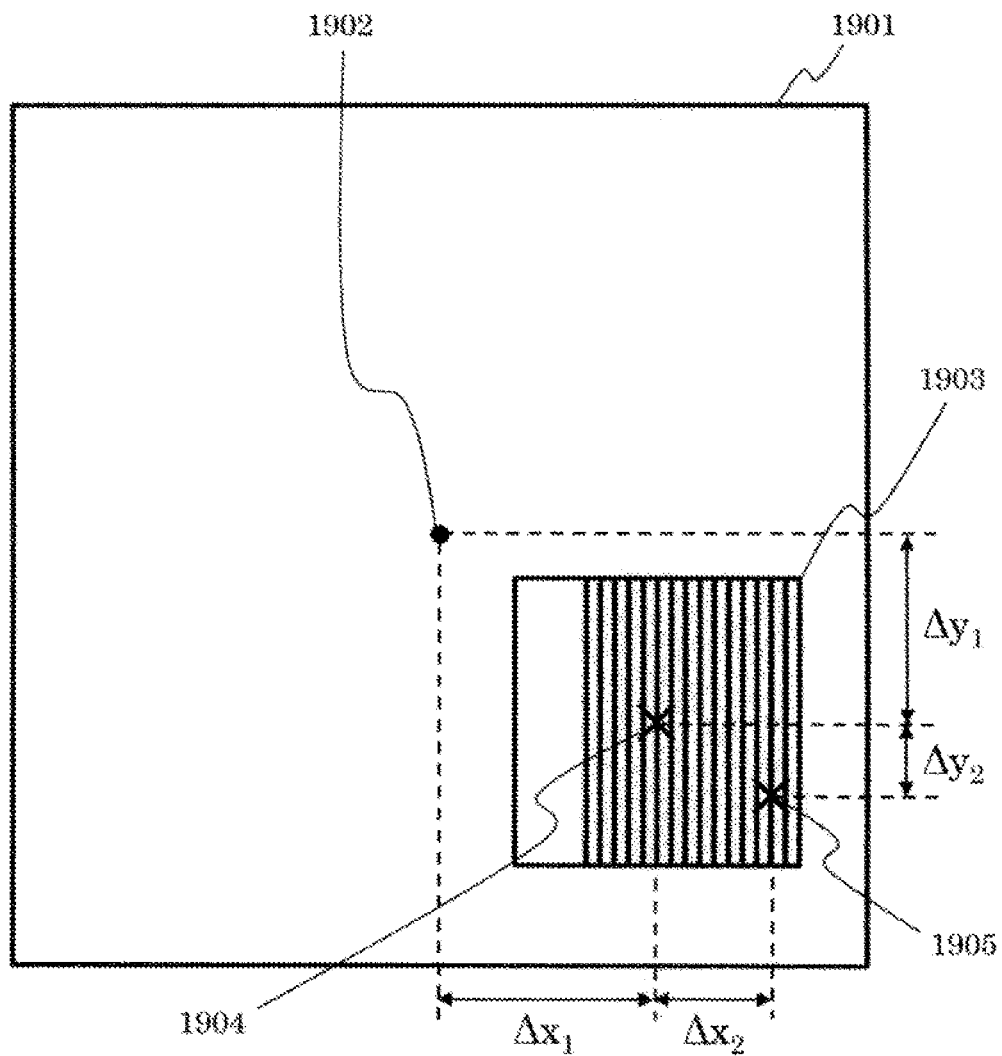

[FIG. 20]
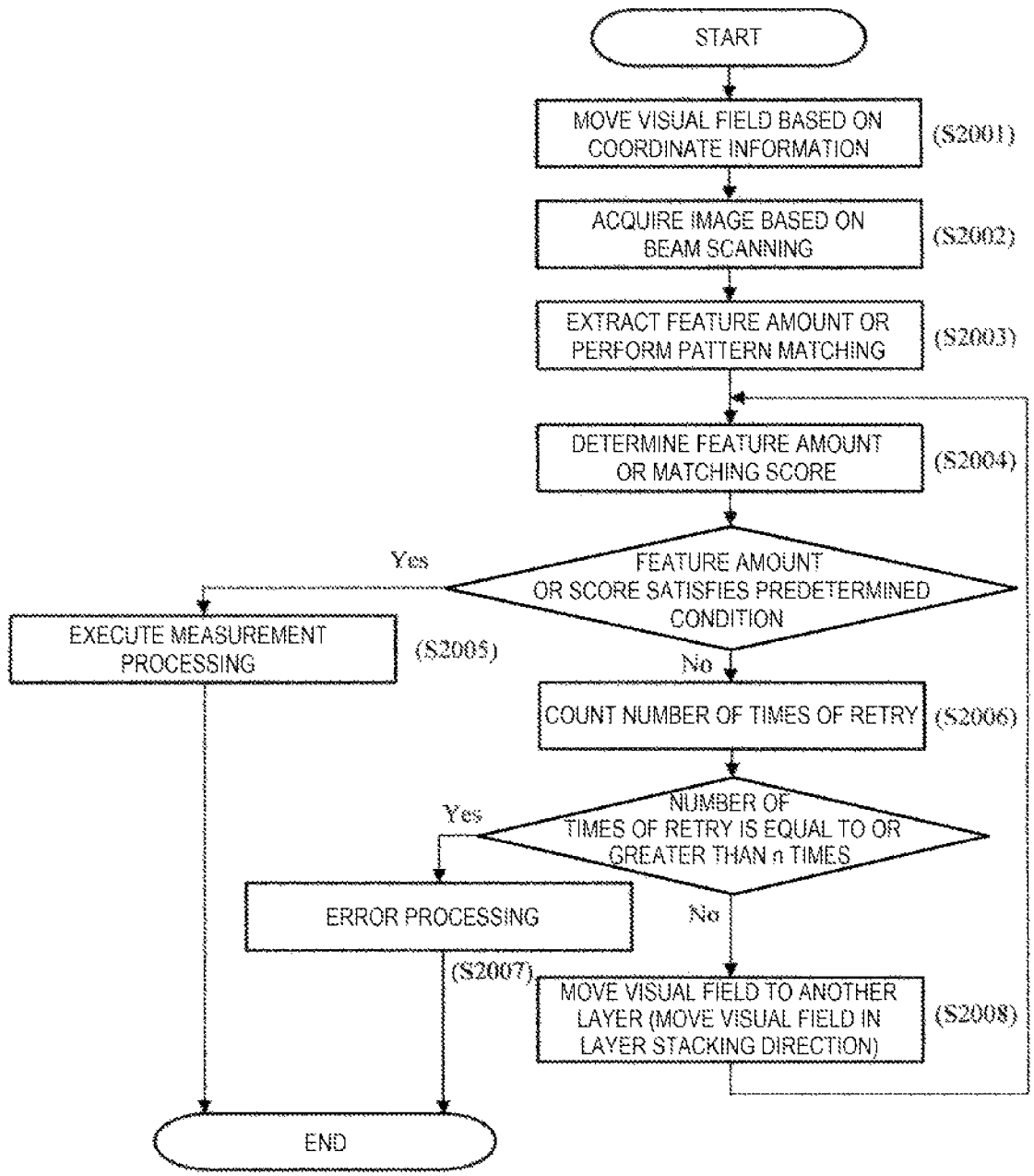

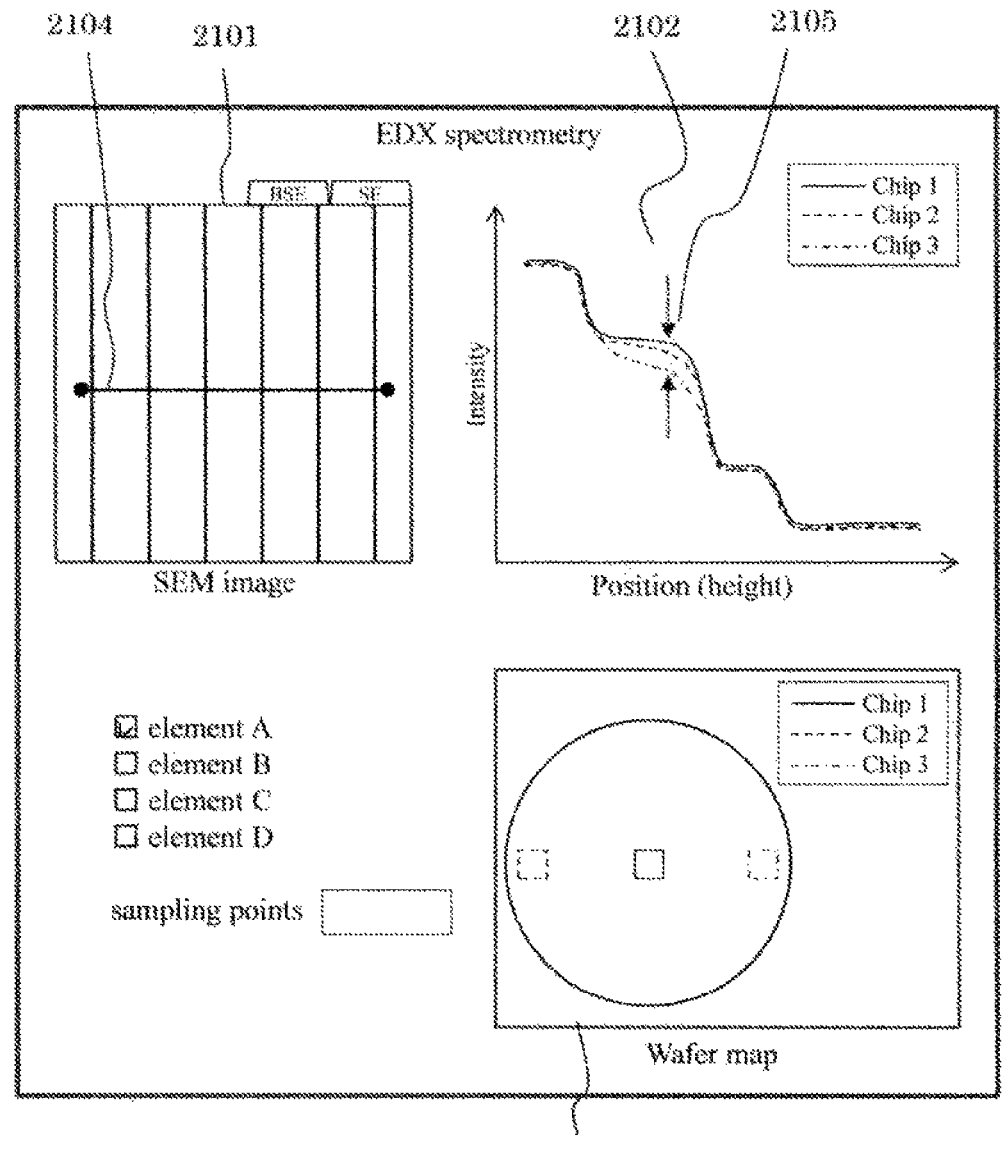
[FIG. 21]

[FIG. 22]
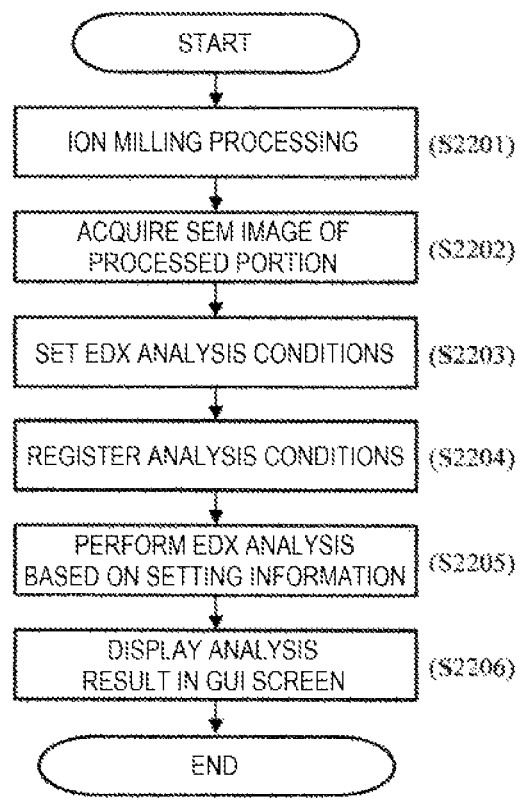

IMAGING METHOD AND IMAGING SYSTEM

TECHNICAL FIELD

The present disclosure relates to an image generation method and an image generation device, and more particularly to a method and a device for imaging an object formed inside a sample.

BACKGROUND ART

In order to observe a cross section of a sample using a scanning electron microscope (SEM), there is a method of sputter etching the sample using an ion milling apparatus and exposing the cross section on a sample surface. PTL 1 discloses an ion milling apparatus in which a sample is placed on a rotating sample table, and an axis of rotation is eccentric with respect to a center of an ion beam to form a processing hole having a flat surface in a wide range. Further, PTL 2 discloses an ion milling apparatus in which a cover on which an opening is formed is placed on a sample to be processed by ion milling, and a sample region located below the opening is selectively milled by using an ion beam passing through the opening.

CITATION LIST

Patent Literature

PTL 1: JP-A-3-36285
PTL 2: JP-A-2003-68243

SUMMARY OF INVENTION

Technical Problem

The inventors newly recalled an observation method for two-dimensionally visualizing each layer included in a multilayer structure when viewed from a stack direction by performing processing to form a gentle slope having a very small inclination angle on a sample which is the multilayer structure. More specifically, when a thickness (dimension in a Z direction) of a certain layer of the multilayer film structure is 70 nm, if a sloped surface having a relative angle of 0.35° with respect to the sample surface can be formed, for example, a sloped surface having a length of 11.5 µm per layer in an X direction can be formed, and a performance of a pattern can be revealed over a plurality of layers. On the other hand, in the ion milling method disclosed in PTL 1, although a processing condition can be adjusted according to the setting of a relative distance between a central axis of the ion beam and the axis of rotation, the sample is processed at an etching rate corresponding to a normal distribution of the ion beam, and therefore, it is difficult to form a surface having a very small inclination angle as described above. Further, the ion milling method disclosed in PTL 2 is the same, and it is difficult to form a gentle sloped surface as described above.

Hereinafter, an imaging method and an imaging system are proposed, the purpose of which is to reveal, over a wide range, information about a plurality of layers contained in a multilayer structure, or form an image of the revealed applicable layers.

Solution to Problem

In order to achieve the above object, an aspect of the invention is to provide an imaging method of forming an image of a target layer included in a sample in which a plurality of layers are stacked or an image of a pattern formed of a plurality of layers, and a system for implementing the imaging method. The imaging method includes: by rotating the sample with an axis in a normal direction of a sample surface as an axis of rotation and irradiating the sample with an ion beam from a direction inclined with respect to the normal direction via a mask which is provided at a position separated from the sample and has an opening through which an ion beam selectively passes, forming a hole having a band-shaped sloped surface region inclined with respect to the sample surface; irradiating the band-shaped sloped surface with a charged particle beam; detecting charged particles obtained based on the irradiation; generating, based on the detection of the charged particles, a first image including a plurality of different band-shaped luminance regions included in the sloped surface; and identifying, by using the first image, the target layer, a luminance region including the pattern formed of the plurality of layers, or the pattern formed of the plurality of layers.

Advantageous Effect

According to the above method, the target layer of the multilayer structure inside the sample can be imaged.

BRIEF DESCRIPTION OF DRAWINGS

FIG. 1 is a flowchart showing a process of observing a cross-sectional position formed based on ion milling on a wafer.

FIG. 2 is a diagram showing an outline of an ion milling apparatus.

FIG. 3 is a diagram showing an example of a tapered portion formed on the wafer by irradiation with an ion beam.

FIG. 4 is a diagram showing a correlation between a width of the tapered portion formed on the wafer and parameters by which the width is determined.

FIG. 5 is a diagram showing an outline of the ion milling apparatus.

FIG. 7 is a diagram showing an example of a sample holder attached to the ion milling apparatus.

FIG. 8 is a diagram showing an outline of a scanning electron microscope.

FIG. 9 is a diagram showing an outline of an imaging system including the ion milling apparatus and the scanning electron microscope.

FIG. 10 is a diagram showing an example of an apparatus condition generation module included in a recipe generation device.

FIG. 11 is a flowchart showing a process of executing measurement based on setting for a processing condition of the ion milling and setting for a measurement condition of the scanning electron microscope.

FIG. 12 is a diagram showing an example of a GUI screen for setting the processing condition and the measurement condition.

FIGS. 13A-13D comprise a diagram showing a mask provided in the ion milling apparatus and a processing mark formed via the mask.

FIG. 14 is a diagram showing a relationship between a size of the opening on the mask and a size of a processing region of the ion milling apparatus.

FIG. 15 is a flowchart showing a process of executing measurement by positioning a visual field of the scanning electron microscope on a layer to be measured.

FIG. 16 is a diagram showing a method of identifying an edge position of the processing mark by template matching.

FIG. 17 is a diagram showing a relationship between a size of the opening on the mask and a size of a processing region of the ion milling apparatus.

FIGS. 18A-18D comprise a diagram showing an outline of an FIN type FET and an example of a cross-sectional image of each height.

FIG. 19 is a diagram showing an example of a template used when executing pattern matching on an SEM image in which a striped pattern is displayed.

FIG. 20 is a flowchart showing a process of identifying a visual field position using a feature amount or a matching score as an index value, and executing the measurement.

FIG. 21 is a diagram showing an example of a GUI screen for setting an elemental analysis condition.

FIG. 22 is a flowchart showing an elemental analysis step.

DESCRIPTION OF EMBODIMENTS

Figure 6A:
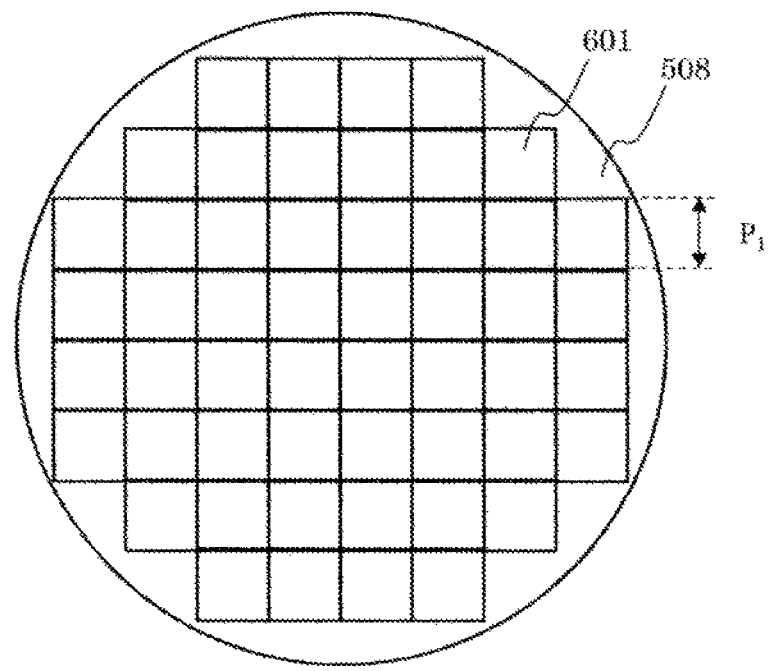
FIGS. 6A and 6B comprise a diagram showing an example of a wafer and a mask having a plurality of openings.

In recent years, as the degree of multilayer stacking of a semiconductor progresses, a measurement apparatus or an inspection apparatus for managing a yield of the semiconductor device has been required to cope with a multilayered device. If elements formed in various regions on a wafer can be observed at various depths, a variation depending on positions in a wafer surface can be effectively figured out.

Embodiments to be described below describe a method, a device, a computer program, and a storage medium for storing the computer program, the purpose of which is to collectively process a plurality of different regions on a large-area sample (wafer) surface at various depths in a longitudinal direction, and observe and measure a three-dimensional processed shape and a material physical property of a three-dimensional element formed therein at a high speed.

The following embodiments describe a method of measuring a three-dimensional structure sample. For example, in a method of observing and measuring a three-dimensional structure sample formed on the wafer, the method described above includes: (a) a step of cutting (diagonally) a plurality of regions in a wafer surface by an ion beam; (b) a step of calculating a position at which the observation and measurement are to be performed at a desired depth in a desired region; and (c) a step of observing and measuring at the calculated position described above. In (a) the step of cutting, the sample surface is selectively cut by, while rotating the sample about an axis of rotation in a direction inclined with respect to an irradiation direction of an ion beam which is substantially uniform over an outer dimension of the sample, irradiating the sample with the ion beam via a mask whose relative position with respect to the sample is fixed (in synchronization with rotation of the sample) and having a plurality of openings allows a part of the ion beam to reach the sample. In (b) the step of calculating the position, a relationship between a surface direction position and a processing depth with respect to the wafer to be cut is obtained, and a position at a desired depth in a desired region is obtained based on the relationship. In (c) the step of observing and measuring, at the position, a surface of the cut sample is observed from above with an electron microscope, or a pattern appearing on the surface is measured.

It is desirable that a cut surface to be observed is inclined with respect to the sample surface before being cut. Further, by forming sloped surfaces at a plurality of positions of the sample, structures at the plurality of positions in a depth direction inside the sample can be observed at a plurality of positions in the sample surface direction. Further, an example will also be described in which a depth corresponding to the pattern appearing on the surface is estimated based on device structure design information and a lateral dimension of the pattern at the depth is measured.

Further, the following embodiments also describe an ion milling apparatus including an ion source, a rotating stage on which a sample to be irradiated with an ion beam emitted from the ion source is held and including an axis of rotation in a direction inclined with respect to an irradiation direction of the ion beam, and a mask which rotates with rotation of the rotating stage and has a plurality of openings that allows a part of the ion beam to reach the sample.

FIG. 1 is a flowchart showing a process of performing observation and measurement after partially processing a sample. First, surfaces of a plurality of regions on the wafer are collectively processed into a bevel shape (sloped shape) with a three-dimensional processing apparatus. Next, in a processing shape calculation unit, a surface depth (height) z after processing is obtained as a function of an in-plane horizontal direction position (x, y), and based on the function, in an observation and measurement position calculation unit, wafer observation positions whose surface depths (heights) are within a desired range in a predetermined region are calculated.

Then, at the positions of the wafer, the surfaces processed into the bevel shape are observed and measured from above with a top surface observation and measurement apparatus such as a critical dimension-scanning electron microscope (CD-SEM) or a review SEM. By performing the observation and measurement on the wafer at the plurality of different depths in the plurality of regions, the three-dimensional processed shape and the material physical property of the three-dimensional element in the plurality of regions can be obtained. If necessary, three-dimensional processing information and design information of the wafer or the element are input to the three-dimensional processing apparatus and the observation and measurement apparatus, and a processing position, a processing amount, the observation position, and the like are controlled. Further, a three-dimensional structure is reconstructed based on an observation image and a measurement result acquired by the observation and measurement apparatus.

FIG. 2 is a diagram showing an outline of the above-described three-dimensional processing apparatus. A parallel ion beam emitted from the ion source is directed at the wafer on a wafer stage. The wafer stage has a structure in which an angle between the wafer surface and the ion beam is variable and the wafer stage rotates on an axis thereof. The apparatus shown in FIG. 2 further includes the mask having the plurality of openings which is disposed above the wafer, and the mask rotates together with the wafer in a state where a relative position of the mask with respect to the wafer is fixed. It is desirable to provide a predetermined gap between the mask and the wafer as described later.

In the three-dimensional processing apparatus, by performing ion milling processing while rotating the wafer and the mask in a state where the beam is not perpendicularly incident on the wafer (a beam traveling direction and a normal direction of the wafer surface do not match), three-dimensional processing can be performed as described below.

First, when the opening is on a side where the ion source and the stage are close to each other (upper side in the figure), the wafer is irradiated with the beam passing through the opening at an angle inclined toward a center side of the wafer. On the other hand, when the opening is on a side where the ion source and the stage are far from each other (lower side in the figure), the wafer is irradiated with the beam passing through the opening at an angle inclined to an outside of the wafer. Since the wafer and the mask move back and forth between the two positions along with the rotation of the stage, an incident angle of the ion beam passing through the opening when viewed from the wafer swings with the rotation.

Here, as shown in FIG. 3, when the mask which blocks the ion beam is provided at a position separated from the wafer surface, only an ion beam having an incident angle of a reaches a point A on the wafer. Further, an ion beam having an incident angle of a to b reaches a point B on the wafer, an ion beam having an incident angle of a to 0 reaches a point C on the wafer, an ion beam having an incident angle of a to −b reaches a point D on the wafer, and an ion beam having an incident angle of a to −a reaches a point E on the wafer.

In this way, as a result of changing an irradiation amount of the ion beam depending on the positions (a milling amount changes), a part 301 on the wafer surface is processed into a tapered shape. For the sake of simplicity, the description has been given on an assumption that the angle is projected onto a cut surface parallel to a paper surface, but in practice, it should be noted that the point C is irradiated with the beam inclined in a direction perpendicular to the paper surface due to the rotation, and is not perpendicular irradiated. Further, in the above description, since a thickness of the mask is assumed to be zero, a center of the tapered portion is directly below an opening edge, but this is not the case with an actual mask having a finite thickness.

A width of the tapered portion can be varied depending on the angle formed by the stage and the beam and a wafer-mask gap. As shown in FIG. 4, a width w of the tapered portion, a wafer-mask gap d, and a mask thickness t have a relationship of approximately $w=2d\times\tan\theta+t\times\tan\theta$. When the wafer-mask gap d is not provided, a sufficient width of the tapered portion cannot be obtained. Therefore, it is desirable to support the mask such that the relative position of the wafer and the mask is fixed while providing a considerable gap between the wafer and the mask. In the embodiments to be described below, by providing the gap d between the mask and the wafer, the tapered portion width can be expanded by $2\ d\times\tan\theta$, and therefore a very gentle sloped surface can be formed.

In other words, since it is possible to cause the ion beam suitable for forming the gentle sloped surface to reach a lower region of the mask, the sloped surface having a uniform inclination angle over a wide range from immediately below the opening to the lower region of the mask can be formed. Since the ion beam whose irradiation amount is limited by the mask reaches a sample region below the mask, a beam whose irradiation amount is limited and which satisfies a condition for forming the gentle sloped surface over the wide range is emitted as compared to a sample region located immediately below the opening.

With respect to a milling rate v and a milling time t of the wide opening, a milling depth h at the point E to which the ion beam having all irradiation angles substantially satisfy $h=v\times t$. The milling rate v changes depending on a current or a voltage of the ion beam. When a mask opening diameter (or a minimum width) is not large enough compared to the mask thickness, since an amount of ions which are blocked by the mask opening at an upper region and pass through the opening decreases in an opening center region, a taper angle of a central portion such as an inside of the opening edge decreases, or the milling amount decreases. It is desirable to take these into consideration when designing an actual mask.

A three-dimensional device to be measured in the embodiments to be described below preferably has a large number of unit elements (memory cells and the like) having the same structure in a predetermined element region. By providing a taper in the element region (memory cell array and the like), a plane image obtained by cutting the unit element from an upper surface at various depths can be observed from the upper surface by an SEM and the like. The three-dimensional structure can be reconstructed by combining the observation images of various depths acquired in this manner. Further, variations in the three-dimensional processed shape of a large number of elements in the region can be obtained.

At this time, parameters such as a stage angle, the wafer-mask gap, and a maximum ion milling amount (an ion current and voltage, and the milling time) are set such that the following conditions are satisfied.

(1) The width and a depth of the tapered portion are set such that a desired depth range in the longitudinal direction to be observed of the three-dimensional device is included in the element region.

(2) The number of unit elements exposed on the surface of the predetermined depth range can be sufficiently secured.

During the milling, the stage angle does not necessarily need to be fixed at a constant value, and may be changed in the middle.

By providing the plurality of openings, the tapered portion as shown in the figure can be processed in the plurality of regions on the wafer. These openings are designed, manufactured, and aligned with the wafer such that the tapered portion is processed in a desired memory array region to be observed, based on information on such as a chip array and a memory cell array region in the chip.

FIG. 5 is a diagram specifically showing the ion milling apparatus described above. A plasma generating unit 501 which generates plasma forms a part of an ion source 502. In the ion source 502, a plasma electrode 503 to which a positive acceleration voltage is applied from a DC power supply (not shown), an extraction electrode 504 to which a negative extraction voltage is applied from the DC power supply (not shown), and a ground electrode 505 are provided. An ion beam 506 is accelerated and extracted by controlling the voltage applied to these electrodes, and a wafer 508 held by a sample holder 507 is irradiated with the ion beam 506. The ion beam 506 is a parallel beam which is not subjected to a focusing action or a deflecting action.

The sample holder 507 is supported by a rotation mechanism 510 having an axis 509 as an axis of rotation, and rotates the wafer 508. The rotation mechanism 510 includes an inclination mechanism 511 which adjusts an irradiation angle of the ion beam 506 with respect to the wafer 508, and a movement mechanism 512 which adjusts a position of the wafer 508 in an A direction. Further, a control device 515 for controlling the ion source 502 and a plurality of drive mechanisms based on a processing condition setting to be described below is provided.

Further, the sample holder 507 is provided with an attachment mechanism 514 (support member) for attaching a mask 513. The attachment mechanism 514 is provided with a mask position adjusting mechanism (not shown), and is configured to be able to position the mask 513 at a desired position in the normal direction (Z direction) of a surface of the wafer 508 and a surface direction (X-Y direction) of the wafer 508. The attachment mechanism 514 is configured to support the mask 513 such that a relative positional relationship between the wafer 508 and the mask 513 does not change when the sample holder is rotated.

Figure 6B:
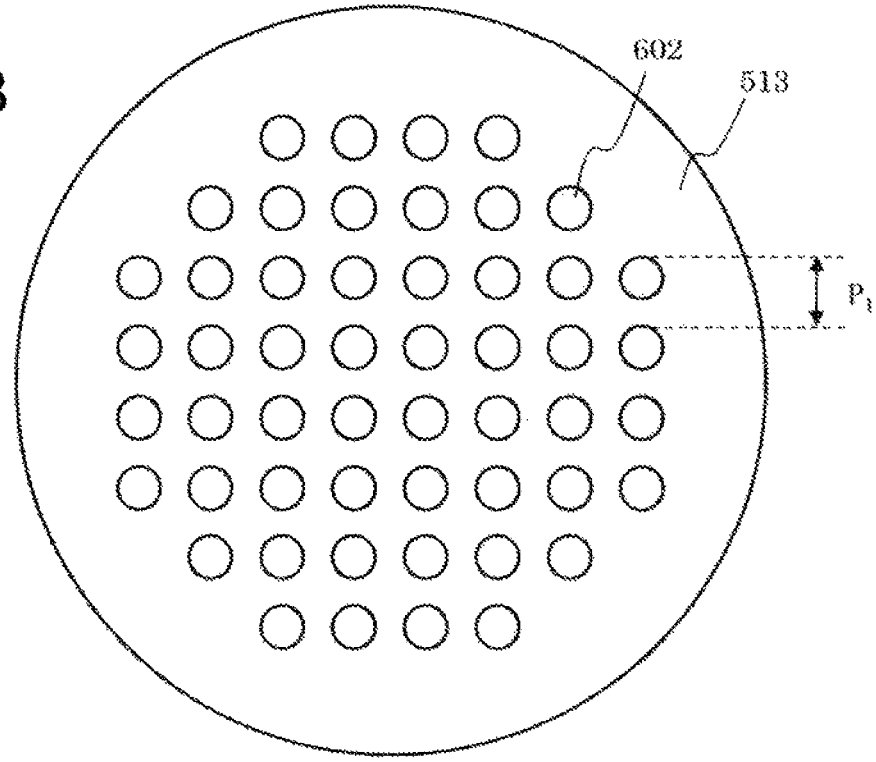

(a) of FIG. 6 is a view of the wafer 508 as viewed from the Z direction, and (b) of FIG. 6 is a view of the mask 513 as viewed from the Z direction. A large number of chips 601 each including an integrated circuit are formed on the wafer 508, and openings 602 are provided in the mask 513 at the same pitch as a chip formation pitch (P1) such that a processing position of the chips 601 are the same. According to such a mask, it is possible to irradiate a corresponding portion of each chip with the beam under the same condition.

FIG. 7 is an enlarged view of the sample holder 507. The sample holder 507 is provided with an electrostatic chuck mechanism 701 for holding the wafer, and the attachment mechanism 514 provided with a position adjustment mechanism capable of adjusting the position of the mask 513 in the X-Y-Z directions is provided on the electrostatic chuck mechanism 701. The attachment mechanism 514 is also controlled by the control device 515.

The wafer 508 and the mask 513 are attached to the sample holder 507 in a load lock chamber (not shown) outside a milling chamber 516, and after vacuum exhaust, the wafer 508 and the mask 513 are moved to the milling chamber and disposed in a predetermined position.

The embodiments to be described below describe an example of the ion milling processing using the mask 513 having the circular openings 602, but the opening may be not limited to a circular shape and may have a linear edge. Immediately below the linear edge, a linear gentle slope is formed along the edge.

Next, an apparatus which measures the wafer processed by the ion milling apparatus shown in FIG. 5 will be described. FIG. 8 is a diagram showing an outline of a scanning electron microscope. An electron beam 803 is extracted from an electron source 801 by an extraction electrode 802 and accelerated by an acceleration electrode (not shown). The accelerated electron beam 803 is narrowed by a condenser lens 804, which is an aspect of a focusing lens, and then deflected by a scanning deflector 805. Accordingly, the electron beam 803 scans a sample 809 one-dimensionally or two-dimensionally. The electron beam 803 emitted to the sample 809 is decelerated by a deceleration electric field formed by applying a negative voltage to an electrode built in a sample table 808, and is focused by an lens action of an objective lens 806 to be emitted to a surface of the sample 809. An inside of a sample chamber 807 is maintained in a vacuum state.

An electron 810 (secondary electron, backscattered electron, and the like) is emitted from an irradiation portion on the sample 809. The emitted electron 810 is accelerated in a direction of the electron source 801 by an acceleration action based on the negative voltage applied to the electrode built in the sample table 808. The accelerated electron 810 collides with a conversion electrode 812 to generate a secondary electron 811. The secondary electron 811 emitted from the conversion electrode 812 is captured by a detector 813, and an output I of the detector 813 changes according to an amount of the captured secondary electron. A brightness of a display device changes in accordance with a change in the output I. For example, in a case of forming a two-dimensional image, a deflection signal to the scanning deflector 805 and the output I of the detector 813 are synchronized to form an image of a scanning region.

Although the SEM shown in FIG. 8 shows an example in which the electron 810 emitted from the sample 809 is once converted into the secondary electron 811 at the conversion electrode 812 and detected, the invention is not limited to such a configuration, and for example, a configuration may be used in which a detection surface of an electron double image tube or a detector is disposed on a trajectory of the accelerated electron. A control device 814 supplies a necessary control signal to each optical element of the SEM in accordance with an operation program called an imaging recipe for controlling the SEM.

Next, a signal detected by the detector 813 is converted into a digital signal by an A/D converter 815 and transmitted to an image processing unit 816. The image processing unit 816 generates an integrated image by integrating signals obtained by a plurality of scans in a frame unit.

Here, an image obtained by one scan of the scan region is referred to as an image of one frame. For example, when integrating images of 8 frames, the integrated image is generated by performing addition averaging processing on signals obtained by eight two-dimensional scans in a pixel unit. It is also possible to scan the same scanning region a plurality of times to generate and save a plurality of images of one frame for each scanning.

Further, the image processing unit 816 includes an image memory 818 which is an image storage medium for temporarily storing a digital image, and a CPU 817 which calculates a feature amount (a dimension value of a width of a line or a hole, a roughness index value, an index value indicating a pattern shape, an area value of a pattern, a pixel position which is an edge position, and the like) based on the image stored in the image memory 818.

The image processing unit 816 further includes a storage medium 819 which stores a measured value of each pattern, a luminance value of each pixel, and the like. Overall control is performed by a workstation 820, and necessary apparatus operations, confirmation of a detection result and the like can be implemented by a graphical user interface (hereinafter referred to as a GUI). The image memory stores an output signal (a signal proportional to an amount of electrons emitted from the sample) of the detector at an address (x, y) on a corresponding memory in synchronization with a scanning signal supplied to the scanning deflector 805. Further, the image processing unit 816 also functions as an arithmetic processing device which generates a line profile based on the luminance value stored in the memory, identifies the edge position by using a threshold method and the like, and measures a dimension between the edges.

FIG. 9 is a diagram showing an example of a pattern measurement system including a recipe generation device 903 which sets an operation program for performing the processing by the ion milling apparatus shown in FIG. 5 and the measurement by the scanning electron microscope shown in FIG. 8. The example of FIG. 9 shows an example in which a scanning electron microscope 901, an ion milling apparatus 902, the recipe generation device 903 which generates the operation program of these apparatuses, and a design data storage medium 904 which stores design data of a semiconductor device or layout data generated based on the design data are connected via a network. An input device 905 including the display device which displays a graphical user interface (GUI) screen to be described below is connected to the recipe generation device 903.

The recipe generation device 903 includes a memory 906 (for example, a non-transitory storage device) to which a detection signal of the secondary electron, the backscattered electron, and the like acquired by the scanning electron microscope 901, a measurement result output by an image processing processor (not shown) built in the scanning electron microscope 901, an executable instruction, and data are loaded, and a processor 907 configured to execute the instruction. The recipe generation device 903 further includes a recipe generation unit 908 including a coordinate calculation module which calculates a desired measurement target pattern position (coordinates) based on sample information (height information of each film constituting a multilayer film, layout data of each layer, and the like) read from the design data storage medium 904, a measurement application 909 including an apparatus condition generation module which sets an apparatus condition of the scanning electron microscope 901 based on coordinate information generated by the recipe generation unit 908, and a processing application 910 including an apparatus condition generation module which sets an apparatus condition of the ion milling apparatus 902 based on the coordinate information.

The recipe generation device 903 may be built in the control device 814 of the scanning electron microscope 901.

For example, as shown in FIG. 10, the recipe generation device 903 includes an apparatus condition generation module 1004, and by inputting layer information 1001 including a pattern to be measured and measurement pattern information 1002 such as a coordinate and a type of the pattern to be measured from the input device 905, the apparatus condition generation module 1004 reads design data of a region including a pattern to be measured of a designated layer from the design data storage medium 904. The apparatus condition generation module 1004 generates a stage condition for positioning the pattern to be measured in the visual field and a visual field movement condition by the deflector based on the input coordinate information and the like. Further, the apparatus condition generation module 1004 sets a measurement condition using the obtained image based on input measurement condition information 1003 (for example, a visual field size, measurement location information in the pattern to be measured, and the like).

Further, the apparatus condition generation module 1004 sets a condition for positioning the visual field in a predetermined layer based on selected layer information. A method thereof will be described later.

Further, the apparatus condition generation module 1004 may obtain the position of the desired pattern to be measured based on processing information 1005 of the ion milling apparatus 902, and the apparatus condition generation module 1004 may set stage coordinate information of the scanning electron microscope 901 and deflection position information of the beam based on the position information (coordinate information).

The control device 814, the image processing unit 816, and the recipe generation unit 908 are constituted by the arithmetic processing device including one or more processors, and the one or more arithmetic processing devices constitute the computer subsystem which controls the scanning electron microscope.

First Embodiment

Hereinafter, a method of measuring a pattern belonging to a desired layer of a 3D NAND flash memory device formed of a multilayer film will be described. In the present embodiment, a pattern included in a memory device having a chip size of about 1 cm square formed on an entire surface of a 300 mm wafer is evaluated. In the sample, the 3D NAND memory cell occupies 80% or more of an area of each chip. Here, a sample in which a large number of channel holes (average diameter is about 60 nm) are regularly formed after a predetermined multilayer film (SiO/SiN, 48 layers) is formed in the middle of a manufacturing process of the device is observed and measured as follows.

The present embodiment describes an example in which the sample is processed and observed based on selection of a pattern to be measured or a layer to which the pattern belongs. FIG. 11 is a flowchart showing a process from a condition setting of an apparatus to execution of the measurement. First, sample information is input from a GUI screen as shown in FIG. 12 (step 1101). The sample information is input by, for example, inputting identification information such as a sample name in a window 1201. Based on the input, the recipe generation device 903 reads the sample information (design data) of the identified sample from the design data storage medium 904. The read design data includes position information and the like of the pattern. Further, thickness information of each layer of the multilayer structure may be stored. In an example of FIG. 12, a 3D-NAND having a 48-layer structure is set.

Further, in a measurement condition input step (step 1102), a chip to be measured is selected from a window 1202. All the chips are selected on the GUI screen shown in FIG. 12, and the apparatus condition generation module 1004 generates an operation program of a scanning electron microscope such that a visual field of the scanning electron microscope is positioned at corresponding locations of all the chips. Further, by selecting a layer (layer information 1001) to which the pattern to be measured belongs from a window 1203, an operation program for executing visual field alignment processing using image processing to be described later is generated. Here, a case is described in which the number of layers from the lowermost layer, the uppermost layer, or a predetermined reference layer is input as the identification information of the layer, but identification information of another layer determined by a user may be input. In the example of FIG. 12, a 32nd layer is selected from the 48 layers. It should be noted that a plurality of layers may be selected.

Further, in a window 1204, a desired measurement position is selected from measurement target candidates included in a band-shaped sloped surface region to be described below. In a window 1205, a measurement algorithm of the pattern to be measured is selected. FIG. 12 shows an example of the GUI screen capable of automatically searching for a pattern suitable for a measurement purpose and automatically setting a measurement condition by inputting the target layer and the measurement purpose, but the visual field position may be determined by inputting a coordinate of the pattern to be measured into a window 1211 in which the coordinate is to be input.

Next, processing conditions of an ion milling apparatus is input (step 1103). In the GUI screen shown in FIG. 12, windows 1206 to 1208 for setting the processing condition are provided, but when the processing condition is fixed and there is no choice, these windows are not necessary.

In the window 1206, an angle of a sloped surface of a processing mark, which will be described later, can be input, and the apparatus condition of the ion milling apparatus is adjusted based on this setting. For example, by selecting an inclination angle, the inclination mechanism 511 and the attachment mechanism 514 are controlled so as to adjust an incident angle of an ion beam with respect to the sample. Automatic control of these mechanisms is performed by registering in advance a relationship between the inclination angle of the processing mark, the inclination angle of the inclination mechanism 511, and a mask position of the attachment mechanism 514 as a table.

Further, in the window 1207, a position at which the sloped surface is formed is set. The attachment mechanism 514 is controlled so as to adjust an irradiation position of the ion beam on the sample in accordance with the setting. By adjusting a position of the mask 513 in an X-Y direction, an arrival position of the ion beam on the wafer 508 can be adjusted. Control of the arrival position of the ion beam may be performed, for example, based on the input of the measurement target position (coordinate) in step 1102.

In the window 1208, a type of the mask is set. The mask is selected in accordance with a size of an opening of the mask, a pitch of the openings (for example, whether the opening is provided for each chip or the opening through which the ion beam is selectively emitted to an identified chip), and the like. In the GUI screen shown in FIG. 12, since a chip to be evaluated (that is, a chip to be processed) is selected in the window 1202, the setting of the type of the mask is not necessary. On the other hand, the chip to be measured may be automatically selected by selecting the type of the mask.

Based on the above settings, in the apparatus condition generation module 1004, conditions for the processing on the wafer by the ion milling apparatus and conditions for the measurement by the scanning electron microscope are set.

In the embodiment described above, various kinds of information and conditions are input in an interactive manner using the GUI, but a condition setting file according to a predetermined format may be prepared in advance, and the condition setting file may be input.

Various parameters can be set on the GUI screen shown in FIG. 12, but necessary parameter input can be reduced by obtaining other parameters from the set parameters. For example, when the layer to which the pattern to be measured belongs and the processing information are input, the apparatus condition generation module 1004 refers to the processing information 1005 to select a coordinate of a region where a gentle slope to be described later is formed as coordinate information for obtaining a low-magnification image, and sets an algorithm for finding a selected layer included in a striped pattern displayed in the low-magnification image after the low-magnification image is acquired. As the algorithm for finding an identified layer from the low-magnification image, for example, the number of linear patterns constituting the striped pattern is counted by image processing, and an algorithm for identifying the position of the selected layer from the striped pattern is constructed.

When a low-magnification image of the gentle slope is present in advance, the image is taken as a template, the position of the layer selected from the templates is identified by the image processing, and after template matching, an operation program for performing visual field movement at an identified position can be constructed.

In the present embodiment, an example in which processing as shown in (b) of FIG. 13 is performed using a mask having the opening as shown in (a) of FIG. 13 will be described. The present embodiment describes a processing method using the mask as shown in (b) of FIG. 6 such that a position corresponding to a memory mat of each chip is irradiated with the ion beam. Since the opening 602 formed in the mask 513 shown in (b) of FIG. 6 is formed at the same pitch as the chip and the ion beam is a parallel beam, the same portion of each chip can be irradiated with the beam under the same condition, and an in-plane distribution of a performance of the pattern can be appropriately evaluated by performing the measurement on the sample on which such processing is performed.

As shown in FIG. 14, the present embodiment describes a processing method of forming a taper in a region 1401 including the memory mat of the device using the mask having an opening having a radius of 3 mm (step 1104). In the present embodiment, the milling mask was fixed to a wafer stage so as to maintain a wafer-mask gap of 1 mm while being aligned with the wafer, and then loaded into a milling chamber, and a stage angle was set such that an angle formed between an opening beam direction and the stage (wafer surface) was 60°.

Next, the stage was rotated, the ion beam was generated, and the wafer was irradiated with the ion beam. Accordingly, a tapered portion having a width of about 1.2 mm was formed in a lower region of a mask edge (see (b) of FIG. 13 and the like). A milling depth is maximized at a central portion of each opening. Here, a relative angle of the sloped surface with respect to a sample surface was set to 0.35°. Accordingly, a milling time is adjusted such that the milling depth is 7.33 μm. Around a position corresponding to the mask opening in a wafer plane, a plurality of recesses having a diameter of about 4.2 mm and a depth of 7.33 μm and having a ring-shaped tapered portion having a width of 1.2 mm were formed.

The 48-layer memory multilayer film of the 3D NAND device is expressed as a striped pattern in the xy plane and in a diameter direction in the ring-shaped tapered portion.

That is, when the tapered portion is observed with an SEM or an optical microscope at a low magnification, the striped pattern is observed due to a difference in a secondary electron generation efficiency, a scattering efficiency, an optical constant, and the like due to a material for each layer.

A height per layer period of the multilayer film is 70 nm based on the design information, and therefore a planar direction period of the striped pattern is about 11.5 μm. That is, pattern information included in an extremely thin film thickness can be expressed by being stretched to about 150 times. When an inside of the stripe of the period of about 11.5 μm is observed with the SEM at a visual field of, for example, about 1 μm square, there are several tens to 100 memory hole patterns therein. These patterns are plane cross sections of the memory holes in the memory layer corresponding to the depth, and processing accuracy at the depth of the region in the wafer plane can be accurately obtained by obtaining an average and a variation of a dimension, a roundness, and the like for a large number of memory holes present in the visual field. In order to perform such evaluation for various depths, the same procedure may be performed at various positions of the striped pattern. Further, since such processing can be performed for each corresponding position of the plurality of chips, a wafer in-plane distribution of three-dimensional information of the multilayer structure can be evaluated at high accuracy.

The apparatus condition of the scanning electron microscope is set in accordance with the processing on the wafer as described above or at other timings. (Step 1105) specifically, the apparatus condition generation module 1004 sets the apparatus condition including a visual field movement condition to a desired pattern included in a desired layer based on the layer information including the pattern to be measured, the pattern to be measured information, the measurement condition information of the scanning electron microscope, and the like received in step 1102.

The apparatus condition generation module 1004 sets a stage condition for positioning the visual field of the electron microscope on the pattern to be measured exposed on the sample surface by the processing based on the coordinate information set in the window 1211. The visual field may be positioned at a position where the sloped surface is formed based on the processing condition stored in advance.

Further, the processing condition until the visual field reaches the desired layer is set according to the target layer information set in the window 1203. In the present embodiment, when the processing is performed to form the sloped surface having an extremely small inclination angle on the wafer on which the multilayer film is stacked, the low-magnification image (second image) is acquired by utilizing a phenomenon in which the striped pattern in which each layer is continuously disposed in a band shape is formed on the sloped surface, and the band (linear pattern) is counted, thereby constructing an algorithm of positioning the visual field at a desired position.

Based on the target layer information input from the window 1203, an operation program for identifying a visual field position for acquiring a high-magnification image (first image) from the low-magnification image is constructed. For example, when the layer to be measured is present in, for example, a 32nd layer from the sample surface, the number of lines is counted using an image processing technique, and when the number of lines is 32, the line can be identified as a cross section of the layer to be measured. Further, when there is a layer which has a feature different from that of other layers and can be identified using the image processing technique on the low-magnification image, the number of layers may be counted with reference to that of the layer. The counting of the layer may be performed, for example, by generating a luminance profile in a direction orthogonal to each line of the striped pattern and causing a processor to count a portion where a luminance exceeds a predetermined value, or may be performed by the image processing.

Further, an algorithm for identifying the position of the target layer by generating a luminance profile in a direction orthogonal to a longitudinal direction of the striped pattern and counting the number of peaks of a waveform may be used.

A measurement recipe is generated through the above-described processes and stored in a predetermined storage medium (step 1106).

FIG. 15 is a flowchart showing a measurement processing process generated by the apparatus condition generation module. First, the wafer is introduced into a sample chamber of the SEM (step 1501), and the stage is moved so as to position the visual field of the scanning electron microscope at the coordinate set in the window 1211 (step 1502). Regarding the coordinate set in the window 1211, when the position of the identified layer in the sloped surface is known, the coordinate of the position may be input, and when the processing condition of the sloped surface is unknown and which position in the sloped surface is taken as the layer to be measured is not known, for example, a center coordinate of the sloped surface may be input, and the stage may be moved so as to position the visual field at the coordinate.

Next, the wafer aligned by the stage movement is scanned with the electron beam to acquire an image (layer search image) for identifying the layer (step 1503). Here, by acquiring the low-magnification (wide visual field (FOV)) image compared to a final measurement image, the position of the layer to be measured is identified from the striped pattern. A size of the image is set so as to include at least a line segment indicating the layer to be measured and a line segment such as a layer serving as a search reference.

After the low-magnification image is acquired, the position of the target layer is identified based on the count processing of the linear pattern set as described above.

In order to acquire the pattern image in the layer identified as described above, the visual field is positioned in the layer, and the high-magnification (narrow FOV) image is acquired (step 1504). A visual field size may be specified on the GUI screen shown in, for example, FIG. 12. When the visual field having the size of 1 μm is set as described above, since about several tens to 100 memory holes are present, the width (dimension value), the circularity, the average value and the variation thereof, and the like are measured based on the luminance profile for the plurality of holes (step 1505). A two-dimensional image of each layer can be formed by beam scanning from a direction (direction substantially perpendicular to the sloped surface in the present embodiment) intersecting with the band-shaped sloped surface.

As described above, the image (second image) visualizing the striped pattern of the sloped surface formed by the ion milling apparatus is generated before acquiring the high-magnification image (first image) used for the measurement, and the layer to be measured is identified using the image, so that the visual field can be positioned appropriately and quickly in the pattern to which the layer to be measured belongs.

The above-described example describes an example in which the visual field is moved based on the coordinate information set in the window 1211, but when the processing position is known in advance, the stage movement may be performed in accordance with the position information. Further, it is also possible to adopt a method in which, after the visual field is positioned at an approximate position, an image to be searched for the template matching is acquired, and the visual field is moved to the desired layer using the template. FIG. 16 shows a template for identifying an outer peripheral position of the sloped surface of the processing mark by the ion milling apparatus and a region where an image to be searched is acquired set at an edge of the processing mark.

As shown in FIG. 16, a template indicating a boundary of a circular processing mark is registered in advance, a reference point on the boundary is identified by pattern matching using the template, and processing of reaching a target visual field by moving the stage or a deflector for moving the visual field so as to move the visual field from the reference point in a direction orthogonal to a boundary line (seen as a straight line in an enlarged image) by d1.

Further, as shown in FIG. 19, by storing a template image 1903 and information ($\Delta x_2$, $\Delta y_2$) relating to a relative distance between a matching position 1904 and a target visual field position 1905 in association with each other, the visual field can be moved from a position 1902 at which a search image 1901 for performing the template matching is acquired to the target visual field position 1905. More specifically, after the search image 1901 for the template matching is acquired, the stage and the deflector may be controlled so as to move the visual field by a sum ($\Delta x_1 + \Delta x_2$, $\Delta y_1 + \Delta y_2$) of the distance ($\Delta x_1$, $\Delta_1$) between the matching position 1904 identified by the template matching and the position 1902 of the current visual field and ($\Delta x_2$, $\Delta y_2$) stored in advance.

As described above, in the electron microscope image having the relatively low magnification, since the striped pattern having one layer as one band is seen on the sloped surface, it is also possible to perform processing of reaching the layer to be measured by counting the number of striped patterns from a reference position by the image processing using the low-magnification image. In this case, after the desired layer is reached, the visual field of the electron microscope may be set to a high magnification, and the target measurement may be executed.

The apparatus condition generation module 1004 sets a control signal of the stage and the deflector for moving the visual field based on the coordinate information and difference information obtained as described above, and generates a control signal of the apparatus at a time of measurement.

As described above, when the recess (processing mark) is observed at the low magnification, a striped pattern as shown on a left side of (c) of FIG. 13 is observed. The number of stripes is equal to the number of layers of the multilayer film, and from an outside of the recess to an inside corresponds to an upper layer to a lower layer of the multilayer film.

Further, by storing the coordinate information (wafer (stage) coordinate) corresponding to each layer obtained as described above, the apparatus condition of the scanning electron microscope can be set only by setting desired layer information when the wafer generated under the same condition is measured. In the present embodiment, the relationship between the wafer (stage) position and a processing depth is calculated based on the thickness information of each layer stored as the design data, and based on the result, the plurality of wafer observation positions (x, y) in the in wafer plane are obtained by the observation and measurement position calculation unit, so that it is possible to perform the high accuracy measurement on the pattern belonging to each layer exposed by the processing by the ion milling apparatus.

Next, the SEM image was acquired at the high magnification on each of the plurality of wafer observation positions, and the dimension, the roundness, and an variation amount thereof of the channel hole pattern in the image were measured (right in (c) of FIG. 13). The obtained SEM was transferred to a storage device and stored. Accordingly, the relationship ((d) of FIG. 13) between the hole dimension for each layer number and the depth of each layer was obtained, and a cross-sectional processing shape and the like of the channel hole were estimated. In addition, the wafer in-plane distribution of the variation in the dimension and the roundness was obtained for each depth. Accordingly, it was possible to detect an etching defect in a peripheral portion of the wafer.

By the ion milling processing as described above, the evaluation sample can be generated in which the pattern information included in the multilayer film is two-dimensionally arranged in a unit of layer, and the processing can be performed under the same condition for each unit of chip or unit of exposure, and thus the in-plane distribution of the wafer related to the performance of the pattern can be appropriately evaluated.

Second Embodiment

Next, an example in which a logic device is measured will be described. The sample is a logic device having a chip size of about 1 cm square formed on an entire surface of a wafer of 300 mm, and SRAM memory cells occupy about 20% of an area of each chip. Here, the wafer was observed and measured as follows at a time point before a replacement metal gate process of a so-called Fin CMOS device was completed and a contact hole was formed in a source, a drain, and a gate in a middle of a device manufacturing process.

In a device region of the SRAM, for example, there are a repetition pattern of a Si fin having a width of about 10 nm and extending in a one-dimensional direction at a pitch of 40 nm and a metal gate pattern having a width of about 20 nm and extending in the one-dimensional direction at a pitch of 60 nm orthogonal to the repetition pattern, and an insulating film is filled between the Si fins and between the metal gates. A silicon epitaxial pattern is formed as a source/drain on the Si fin where the metal gate does not exist, a gate insulating film is present between the Si fin and the metal gate, and a spacer insulating film is present between the metal gate and the source/drain.

First, as shown in FIG. 17, as a milling mask, the mask 513 in which openings having a radius of 1 mm were arranged at the same pitch as the chip was attached to an ion milling apparatus and milling processing was performed to form a hole having a tapered portion at a position corresponding to an SRAM cell region of each chip.

The openings formed in the mask are arranged at the same pitch as a shot of the chip or an exposure device. By attaching the mask by adjusting an opening position such that an edge of the mask overlaps with a center of the SRAM cell region, all central portions of the tapered portions formed by the ion beams passing through the respective openings overlap with substantially the center of the SRAM cell region.

When processing is performed, the milling mask having a thickness of 0.15 mm was fixed to a wafer stage so as to maintain a wafer-mask gap of 0.1 mm while being aligned with the wafer, and then loaded into a milling chamber, and a stage angle was set such that an angle formed between an opening beam direction and the stage (wafer surface) was 30°.

Next, the stage was rotated, and the wafer was irradiated with the ion beam. Accordingly, a tapered portion having a width of about 0.2 mm was formed in a lower region of a mask edge.

A milling depth is maximized at a central portion of each opening. Milling was performed until the depth reached 500 nm. As a result, around a position corresponding to the mask opening in the wafer plane, a plurality of recesses having a bottom diameter of about 1.2 mm and a depth of 500 nm and having a tapered portion having a width of 0.6 mm were formed.

When the wafer processed in this way is introduced into the sample chamber of the scanning electron microscope as shown in FIG. 8 and an image of a processed portion is acquired, the striped pattern as shown in (c) of FIG. 13 is confirmed. A brightness of each line forming the striped pattern changes depending on a material contained in the line. For example, when a multi-channel FET shown in (a) of FIG. 18 is included in a tapered portion 1701, a cross section A includes a metal gate 1802 and an interlayer insulating film ($SiO_2$) surrounding the metal gate 1802. In order to understand a structure of the FET, (a) of FIG. 18 shows a state where there is no interlayer insulating film.

A cross section B includes a dummy gate 1802, a fin 1801 (silicon), an insulating film 1803 (SiN), and the interlayer insulating film. Further, a cross section C includes an oxide film 1804 and the fin 1801.

When a gentle slope is processed by the ion milling apparatus, the striped pattern appears on a processed surface in a line shape in an order of cross section A, cross section B, and cross section C from a sample surface. Further, since combinations of the materials included in the respective cross sections are different from each other as described above, the brightness of each line changes according to a difference in a secondary electron generation efficiency δ when the electron beam is emitted, and the striped pattern as described above is seen.

The present embodiment describes a method and a device of acquiring images of a plurality of line patterns (striped patterns) appearing on the processed surface, and positioning the visual field on a desired measurement and inspection location by using the images.

First, as a first method, it is conceivable that a template screen 1901 as shown in FIG. 19 is stored in advance, and after template matching, the visual field is also positioned at a target location based on distance information between a template coordinate 1903 and a target location 1902 stored in advance.

As a second method, it is conceivable to, as described in the first embodiment, count the number of lines and position the visual field with a position where the number reaches a desired number as a target position.

Further, as a third method, it is conceivable to position the visual field at the target location based on acquisition of the high-magnification image close to a measurement magnification without acquiring an image for template matching at a low magnification (an image having a larger visual field than that of an image used for measurement or inspection). FIG. 20 is a flowchart showing a measurement process of a semiconductor device using the scanning electron microscope. The control device 814 controls each control target of the scanning electron microscope in accordance with an operation program stored in advance.

First, the control device 814 moves the visual field using the stage 808 and the deflector for moving the visual field based on the coordinate information of a measurement target, the coordinate information of the processing position, and the like (step 2001). After the visual field is moved, the image is acquired based on beam scanning (step 2002). (b), (c), and (d) of FIG. 18 are diagrams showing examples of high-magnification images obtained in the cross section A, the cross section B, and the cross section C, respectively. For example, the high-magnification image of the cross section A includes the dummy gate 1802 and an interlayer insulating film 1805 surrounding the dummy gate. Next, for the obtained image, feature amount extraction or pattern matching using the template registered in advance is performed, and the feature amount and matching score are determined (steps 2003 and 2004). The feature amount is, for example, a dimension value of the pattern or an edge placement error (EPE) value.

When a target visual field position is in a region where the cross section C appears, it is assumed that the image of the cross section A is acquired in step 2002. When processing of forming a line profile in an x direction and outputting a dimension value between peaks is performed in order to obtain the feature amount (dimension value) for the image of the cross section A, a value different from the image of the cross section C where a dimension value of the fin 1801 is output is output. Therefore, it is possible to determine whether the image acquired in step 2002 is an image of the target position based on determination as to whether the feature amount matches or falls within a predetermined range.

Further, the image of the cross section C may be registered as a template, and it may be determined whether the image is the image of the target position based on score evaluation by the template matching. Further, a plurality of templates (in a case of the present embodiment, the templates of cross sections A, B, and C) may be prepared, and the template matching may be performed a plurality of times to identify whether the current visual field position is located at any cross-sectional position of A to C.

When the feature amount or the score satisfies a predetermined condition (when the visual field is positioned at the target position), an image is acquired at the position and at a position separated by a predetermined distance from the position, and measurement using the image is performed (step 2005). Further, the measurement may be performed using the image acquired in step 2002.

In a case where it is determined in step 2004 that the predetermined condition is not satisfied (when the visual field is not positioned at the target position), even though the processing of moving the visual field toward the target position is performed, when the number of times of retry of the visual field movement and the score determination exceeds a predetermined number of times, since a case where the processing is not appropriately performed and it is difficult to acquire an appropriate image may be considered, error processing (step 2007) may be performed and the apparatus may be stopped.

Further, in step 2008, when a distance between the target position and the current position is known (for example, when it is known by the matching which cross section the current visual field is positioned and a distance between the cross sections is also known in advance), the visual field is moved by the distance. Further, when the distance is unknown, the visual field may be positioned at the target position by repeating the movement by a predetermined distance.

According to the present embodiment, since it is possible to identify the desired pattern based on the image processing on a processed surface in which the cross-sectional views of a plurality of heights in an x-y direction are visualized over a wide range, a performance of the patterns at various heights can be easily evaluated.

Further, a change in a height direction of the pattern of a certain layer can be known from a difference between measurement results of an upper portion and a lower region of the taper in the same stripe region.

Third Embodiment

Next, an example will be described in which elemental analysis of a processed surface is performed based on electron beam irradiation on the processed surface formed by an ion milling apparatus. In order to implement such an analysis, in addition to the detector 813 which detects the electrons, a detector for energy dispersive X-ray spectrometry (EDX) is provided in the scanning electron microscope as shown in FIG. 8.

FIG. 21 is a diagram showing an example of a GUI screen for setting EDX analysis conditions. The GUI screen includes an SEM image display region 2101, an analysis result display region 2102, and a chip to be measured setting region 2103.

FIG. 22 is a flowchart showing an operation process of performing EDX analysis. First, processing is executed to form a tapered portion using the ion milling apparatus as shown in FIG. 5 (step 2201). At this time, by executing the processing in a state where the mask 513 shown in FIG. 6 is attached to the ion milling apparatus, the tapered portion is formed at the same location of each chip of the wafer. Next, an SEM image of a processed portion (tapered portion) is acquired (step 2202). In step 2202, for subsequent automatic measurement, a visual field is positioned at the tapered portion of one chip, and an image is acquired at a magnification at which a striped pattern is displayed at the tapered portion. The control device 814 displays the acquired image in the SEM image display region 2101.

Further, a high-magnification image including a portion to be analyzed of a circuit pattern of a desired layer may be acquired and displayed in the SEM image display region 2101 by the same method as that described in the first or second embodiment.

Next, the analysis conditions are set from the GUI screen as shown in FIG. 21 (step 2203). On the GUI screen, an analysis target part 2104 which is an EDX analysis target is set in the SEM image display region 2101. The control device 814 identifies a coordinate of the analysis target part in the SEM image in which coordinate information is stored in association with the setting, and registers the coordinate as an operation condition. Further, the number of analysis points in the part 2104 is determined by setting the number of sampling points. Further, a chip to be analyzed is selected in the chip to be measured setting region 2103. The GUI screen of FIG. 21 shows an example in which three chips at a center and left and right sides are selected. The control device 814 sets the coordinate information such that the same location is to be analyzed for each of the selected chips.

The analysis conditions set as described above are registered in a predetermined storage medium as automatic analysis conditions of the scanning electron microscope (step 2204).

The control device 814 performs the EDX analysis based on the registered analysis conditions (step 2205). The control device 814 obtains a concentration of a contained element by detecting intensity (count number) of a characteristic X-ray corresponding to each element based on an output of an EDX detector.

An analysis result obtained through the above steps is displayed on the GUI screen as shown in FIG. 21 (step 2206). In the example of FIG. 21, the analysis result at a plurality of positions corresponding to the part 2104 of the three chips is displayed in the analysis result display region 2102. In the analysis result display region 2102, a graph in which a horizontal axis represents a position in the part 2104 and a vertical axis represents the intensity of the characteristic X-ray is displayed. Since the analysis target part 2104 is set on an inclined processed surface, transition of a content amount of each element accompanying the change in the height is displayed in the analysis result display region 2102. By performing such display, a variation in the content amount of an identified element for each height can be visualized. In the example of FIG. 21, it can be seen that an element A varies at an identified height 2105.

By performing the gentle slope processing, the information in the height direction (z direction) can be visualized in an x-y plane, and further, the change in the content amount of the identified element accompanying a displacement in the height direction can be easily visualized.

REFERENCE SIGN LIST

501 plasma generating unit
502 ion source
503 plasma electrode
504 extraction electrode
505 ground electrode
506 ion beam
507 sample holder
508 wafer
509 axis of rotation
510 rotation mechanism
511 inclination mechanism
512 movement mechanism
513 mask
514 attachment mechanism
515 control device
516 milling chamber
801 electron source
802 extraction electrode
803 electron beam
804 condenser lens
805 scanning deflector
806 objective lens
807 sample chamber
808 sample table
809 sample
810 electron
811 secondary electron
812 conversion electrode
813 detector
814 control device
815 A/D converter
816 image processing unit
817 CPU
818 image memory
819 storage medium
820 workstation
901 scanning electron microscope
902 ion milling apparatus
903 recipe generation device
904 design data storage medium
905 input device

The invention claimed is:

1. A method of forming an image of a target layer included in a sample in which a plurality of layers are stacked or an image of a pattern formed of a plurality of layers, the method comprising:

by rotating the sample with an axis in a normal direction of a sample surface as an axis of rotation and irradiating the sample with an ion beam from a direction inclined with respect to the normal direction via a mask which is provided at a position separated from the sample and has an opening through which an ion beam selectively passes, forming a hole having a band-shaped sloped surface region inclined with respect to the sample surface;

irradiating the band-shaped sloped surface with a charged particle beam;

detecting charged particles obtained based on the irradiation;

generating, based on the detection of the charged particles, a first image including a plurality of different band-shaped luminance regions included in the sloped surface; and identifying, by using the first image, the target layer, a luminance region including the pattern formed of the plurality of layers, or the pattern formed of the plurality of layers.

2. The method according to claim 1, wherein
the sample is rotated in a state where a relative positional relationship between the mask and the sample is fixed.

3. The method according to claim 2, wherein
the mask is a plate-shaped body, and the sample is rotated in a state where a surface of the plate-shaped body facing the sample surface and the sample surface are parallel to each other.

4. The method according to claim 3, wherein
the plate-shaped body is provided with a plurality of openings.

5. The method according to claim 4, wherein
the sample is a semiconductor wafer, and the plurality of openings of the plate-shaped body are provided so as to form the holes at positions corresponding to a plurality of chips included in the semiconductor wafer.

6. The method according to claim 1, wherein
by performing template matching between a template image on which a striped pattern registered in advance is displayed and the first image, the target layer, the luminance region including the pattern formed of the plurality of layers, or the pattern formed of the plurality of layers are identified.

7. The method according to claim 1, wherein
by counting the number of the plurality of different band-shaped luminance regions included in the first image, the target layer, the luminance region including the pattern formed of the plurality of layers, or the pattern formed of the plurality of layers are identified.

8. The method according to claim 1, wherein
an image is acquired in each irradiation region while moving an irradiation position of the charged particle beam in a direction intersecting a longitudinal direction of a band of the plurality of different band-shaped luminance regions, and a pattern appearing on the sloped surface is measured based on beam irradiation on a luminance region in which a feature amount obtained from the image acquired in each region satisfies a predetermined condition.

9. The method according to claim 1, wherein
an image is acquired in each irradiation region while moving an irradiation position of the charged particle beam in a direction intersecting a longitudinal direction of a band of the plurality of different band-shaped luminance regions, a pattern matching is executed between the image obtained in each irradiation region and a template registered in advance, and a pattern appearing on the sloped surface is measured based on beam irradiation on a luminance region in which a matching score satisfies a predetermined condition.

10. An imaging system comprising:
a beam irradiation subsystem configured to irradiate a wafer with a beam and generate an output corresponding to a signal from the wafer; and
a computer subsystem, wherein
the computer subsystem controls the beam irradiation subsystem to receive a first image formed based on irradiation of a charged particle beam on a band-shaped sloped surface formed on a sample, perform template matching between the first image and a template image in which a plurality of different band-shaped luminance regions registered in advance are displayed, and position a visual field of the beam irradiation subsystem in a band-shaped luminance region having a known positional relationship with a position identified by the template matching.

11. The imaging system according to claim 10, further comprising:
an ion beam device including an ion source configured to emit an ion beam from a direction inclined with respect to a normal direction of a wafer surface, a rotating stage including an axis of rotation in the normal direction, and a mask attached to the rotating stage and having an opening through which the ion beam partially passes, wherein
the computer subsystem controls the beam irradiation subsystem such that the band-shaped sloped surface formed by the ion beam device is irradiated with the beam.

12. An imaging system comprising:
a beam irradiation subsystem configured to irradiate a wafer with a beam and generate an output corresponding to a signal from the wafer; and
a computer subsystem, wherein
the computer subsystem controls the beam irradiation subsystem to receive a first image formed based on irradiation of a charged particle beam on a band-shaped sloped surface formed on a sample, count the number of a plurality of different band-shaped luminance regions included in the first image, and position a visual field of the beam irradiation subsystem in a luminance region having a predetermined count number.

13. The imaging system according to claim 12, further comprising:
an ion beam device including an ion source configured to emit an ion beam from a direction inclined with respect to a normal direction of a wafer surface, a rotating stage including an axis of rotation in the normal direction, and a mask attached to the rotating stage and having an opening through which the ion beam partially passes, wherein
the computer subsystem controls the beam irradiation subsystem such that the band-shaped sloped surface formed by the ion beam device is irradiated with the beam.

14. An imaging system comprising:
a beam irradiation subsystem configured to irradiate a wafer with a beam and generate an output corresponding to a signal from the wafer; and
a computer subsystem, wherein
the computer subsystem controls the beam irradiation subsystem to receive a first image formed based on irradiation of a charged particle beam on a band-shaped sloped surface formed on a sample, acquire an image in each irradiation region while moving a visual field in a direction intersecting with a longitudinal direction of a plurality of different band-shaped luminance regions included in the first image, and measure a pattern appearing on the sloped surface based on beam irradiation on a luminance region in which a feature amount obtained from the image acquired in each region satisfies a predetermined condition or beam irradiation on a luminance region in which a matching score obtained by pattern matching executed between the image obtained in each irradiation region and a template registered in advance satisfies a predetermined condition.

15. The imaging system according to claim 14, further comprising:
an ion beam device including an ion source configured to emit an ion beam from a direction inclined with respect to a normal direction of a wafer surface, a rotating stage including an axis of rotation in the normal direction, and a mask attached to the rotating stage and having an opening through which the ion beam partially passes, wherein
the computer subsystem controls the beam irradiation subsystem such that the band-shaped sloped surface formed by the ion beam device is irradiated with the beam.

16. An ion milling apparatus comprising:
- an ion beam source configured to emit a parallel beam parallel to an irradiation direction of a beam;
- a rotating stage configured to hold a wafer to be irradiated with the parallel beam and including an axis of rotation sloped with respect to the irradiation direction of the parallel beam;
- a mask provided between the wafer and the ion beam source at a position separated from the wafer and having a plurality of openings through which the parallel beam partially passes; and
- a support member configured to support the mask in a state where a relative position between the mask and the wafer is fixed during rotation of the rotating stage.

17. The ion milling apparatus according to claim 16, wherein
- the plurality of openings are formed at the same pitch interval as chips formed on the wafer.

* * * * *